US012723187B2

(12) United States Patent
Baxter, Jr. et al.

(10) Patent No.: US 12,723,187 B2

(45) Date of Patent: Sep. 1, 2026

(54) COMPOSITIONS CONTAINING POLYISOBUTYLENE, PROCESSES FOR PRODUCING, AND USES THEREOF

(71) Applicant: NTP Tec, LLC, Boerne, TX (US)

(72) Inventors: Clyde Edward Baxter, Jr., League City, TX (US); Mark Roll, Boerne, TX (US); Billy W. Waycaster, Cypress, TX (US)

(73) Assignee: NTP Tec, LLC, Boerne, TX (US)

( * ) Notice: Subject to any disclaimer, the term of this patent is extended or adjusted under 35 U.S.C. 154(b) by 0 days.

(21) Appl. No.: 19/359,851

(22) Filed: Oct. 16, 2025

(65) Prior Publication Data

US 2026/0109892 A1 Apr. 23, 2026

Related U.S. Application Data

(60) Provisional application No. 63/708,336, filed on Oct. 17, 2024.

(51) Int. Cl.

| | |
|---|---|
| ***C09K 5/10*** | (2006.01) |
| ***C08F 136/08*** | (2006.01) |
| ***C08K 3/014*** | (2018.01) |
| ***C08K 5/101*** | (2006.01) |
| ***C08K 5/103*** | (2006.01) |
| ***C08L 47/00*** | (2006.01) |
| ***C09K 5/06*** | (2006.01) |
| ***H05K 7/20*** | (2006.01) |

(52) U.S. Cl.

CPC .............. *C09K 5/10* (2013.01); *C08F 136/08* (2013.01); *C08K 3/014* (2018.01); *C08K 5/101* (2013.01); *C08K 5/103* (2013.01); *C08L 47/00* (2013.01); *C09K 5/063* (2013.01); *H05K 7/20236* (2013.01); *C08L 2207/324* (2013.01)

(58) Field of Classification Search

CPC ......... C09K 5/10; C09K 5/063; C08F 136/08; C08K 3/014; C08K 5/101; C08K 5/103; C08L 47/00; C08L 2207/324; H05K 7/20236

See application file for complete search history.

(56) References Cited

U.S. PATENT DOCUMENTS

| | | | | |
|---|---|---|---|---|
| 7,056,990 | B2 | 6/2006 | Baxter et al. | |
| 9,617,363 | B1 * | 4/2017 | Kumar .................. | C08F 110/10 |
| 12,122,954 | B2 | 10/2024 | Agiral et al. | |
| 12,305,111 | B2 | 5/2025 | Short et al. | |
| 2013/0317189 | A1 * | 11/2013 | Baxter, Jr. ................ | C08F 4/14 526/210 |
| 2014/0235810 | A1 | 8/2014 | Shaikh | |
| 2015/0319889 | A1 | 11/2015 | Flory et al. | |
| 2021/0219455 | A1 | 7/2021 | Lau | |
| 2022/0081540 | A1 * | 3/2022 | Park ........................ | C08F 10/10 |
| 2023/0205121 | A1 | 6/2023 | Sone | |
| 2023/0313015 | A1 | 10/2023 | Hartikainen et al. | |
| 2023/0365850 | A1 | 11/2023 | Kramer et al. | |
| 2023/0416583 | A1 | 12/2023 | Agiral et al. | |
| 2024/0047778 | A1 | 2/2024 | Agiral et al. | |
| 2024/0067854 | A1 | 2/2024 | Agiral et al. | |

FOREIGN PATENT DOCUMENTS

| | | | |
|---|---|---|---|
| WO | 2020257368 | A1 | 12/2020 |
| WO | 2022076207 | A1 | 4/2022 |
| WO | 2023009472 | A1 | 2/2023 |
| WO | 2023114449 | A1 | 6/2023 |
| WO | 2023205120 | A1 | 10/2023 |
| WO | 2023205121 | A1 | 10/2023 |
| WO | 2023205122 | A1 | 10/2023 |

OTHER PUBLICATIONS

International Search Report And Written Opinion Dated Feb. 5, 2026 For Application No. PCT/US2025/051187.

* cited by examiner

*Primary Examiner* — Andrew J. Oyer

(74) *Attorney, Agent, or Firm* — Patterson + Sheridan, LLP

(57) ABSTRACT

Aspects of the present disclosure generally relate to a new class of heat transfer compositions. The heat transfer compositions include an HR-PIB. Heat transfer compositions described herein may further include an additional base fluid, an optional additive, or a combination thereof. Aspects described herein also generally relate to processes for producing the heat transfer compositions and to uses of the heat transfer compositions in, for example, immersion cooling applications. Aspects of the present disclosure also generally relate to heat management systems that include one or more heat-generating articles and a heat transfer composition that includes HR-PIB.

20 Claims, No Drawings

COMPOSITIONS CONTAINING POLYISOBUTYLENE, PROCESSES FOR PRODUCING, AND USES THEREOF

CROSS-REFERENCE TO RELATED APPLICATIONS

This application claims priority to and benefit from U.S. Provisional Application No. 63/708,336, filed on Oct. 17, 2024, which is incorporated herein by reference in its entirety.

FIELD

Aspects of the present disclosure generally relate to a new class of heat transfer compositions comprising highly reactive polyisobutylene (HR-PIB). Aspects described herein also generally relate to processes for producing the heat transfer compositions and to uses of the heat transfer compositions in, for example, immersion cooling applications. Aspects of the present disclosure also generally relate to heat management systems.

BACKGROUND

The power consumption of various types of processor units (such as XPUs (for example, central processing units (CPUs), graphics processing units (GPUs)), add-in cards, and memories are increasing generation-over-generation. As high-performance computing, artificial intelligence (AI), machine learning, and cryptocurrency mining have expanded, so too has the demand for efficient cooling systems capable of managing the significant heat generated by these systems. Traditional air-based cooling methods are inadequate for handling the high heat loads produced by modern computing environments, resulting in inefficient energy use and system instability. Immersion cooling, in which electronic components are submerged in dielectric fluids to facilitate direct heat transfer, has emerged as an effective solution for the cooling of high-performance computing systems, such as data center servers, due to its high heat capture rate, enablement of low power usage effectiveness (PUE), high component reliability in corrosive atmospheric conditions, and modular and scalable designs.

Conventional immersion cooling fluids, such as fluorocarbon-based products and mineral oils, offer some advantages, but have notable limitations. For example, fluorinated fluids are costly and pose environmental concerns, while mineral oils suffer from poor thermal conductivity and limited stability. Overall, conventional immersion cooling fluids are ineffective, not environmentally sustainable, cost inefficient, and unable to meet the demands of current and next-generation computing systems.

There is a need for new heat transfer compositions, heat management methods, and heat management systems.

SUMMARY

Aspects of the present disclosure generally relate to a new class of heat transfer compositions comprising HR-PIB. Aspects described herein also generally relate to processes for producing the heat transfer compositions and to uses of the heat transfer compositions in, for example, immersion cooling applications such as single-phase immersion cooling applications. Aspects of the present disclosure also generally relate to heat management systems. Relative to conventional compositions, compositions of the present disclosure may provide, for example, improved thermal management and/or improved electrical insulation in various computing environments such as high-performance computing environments.

Compositions described herein provide a high-performance heat transfer composition capable of addressing the challenges posed by modern computing systems. Heat transfer compositions of the present disclosure include HR-PIB. Such a composition offers superior properties such as thermal conductivity, dielectric strength, environmental sustainability, long-term stability, or combinations thereof relative to conventional immersion cooling fluids. Further, heat transfer compositions may be a blend of (a) HR-PIB; (b) an optional additional base fluid; and (c) an optional additive. Such compositions also offer superior properties such as thermal conductivity, dielectric strength, environmental sustainability, long-term stability, or combinations thereof relative to state-of-the-art immersion cooling fluids. Compositions described herein may be useful for current or next-generation cooling systems in, for example, data centers, AI-driven computing, cryptocurrency mining, and edge computing applications, where both thermal management and electrical insulation are useful for operational efficiency.

In another aspect, a heat transfer composition is provided. The heat transfer composition includes a base fluid, the base fluid comprising HR-PIB.

In another aspect, a heat transfer composition is provided. The heat transfer composition includes a base fluid, the base fluid comprising HR-PIB, the HR-PIB comprising: a first portion comprising polymer chains having alpha vinylidene groups; a second portion comprising polymer chains having beta vinylidene groups; a third portion comprising polymer chains having internal vinylidene groups, the internal vinylidene groups different from the beta vinylidene groups; an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and an amount of the second portion plus the third portion that is in a range from 0 wt % to less than 25 wt % based on the total wt % of the first portion, the second portion, and the third portion of the HR-PIB.

In another aspect, a heat management method is provided. The heat management method comprises contacting one or more heat-generating articles with a heat transfer composition described herein.

In another aspect, a heat management system is provided. The heat management system includes one or more heat-generating articles. The heat management system further includes a heat transfer composition described herein.

In an aspect, a heat transfer composition is provided. The heat transfer composition includes a base fluid, the base fluid comprising HR-PIB. The heat transfer composition may be utilized for immersion cooling.

In another aspect, a process for producing a heat transfer composition is provided. The process includes forming a heat transfer composition described herein, by, for example, blending, mixing, high-shear mixing sonication, ultrasonication, cavitation, ultrasonic cavitation, or combinations thereof one or more components of a heat transfer composition.

In another aspect, a process for producing a heat transfer composition is provided. The process includes dispersing a thermally conductive material in a base fluid under high-shear mixing conditions to form a mixture. The process further includes optionally filtering the mixture to produce a heat transfer composition described herein.

In another aspect, a heat management method is provided. The heat management method includes introducing a heat transfer composition described herein with an electronic component.

In another aspect, an immersion cooling method is provided. The immersion cooling method includes introducing a heat transfer composition described herein with an electronic component.

DETAILED DESCRIPTION

Aspects of the present disclosure generally relate to a new class of heat transfer compositions comprising highly reactive polyisobutylene (HR-PIB). Aspects described herein also generally relate to processes for producing the heat transfer compositions. Aspects described herein also generally relate to uses of the heat transfer compositions in, for example, immersion cooling, thermal management, heat management, heat transfer, or other suitable applications. Aspects of the present disclosure also generally relate to heat management systems.

As described above, various conventional fluids have been investigated as cooling fluids to address the increasing demands of high-performance computing systems, including artificial intelligence (AI), data centers, cryptocurrency mining, and other industrial applications. While conventional fluids may offer certain advantages, they also come with significant drawbacks that hinder their suitability as future cooling solutions. The most commonly used conventional fluids for immersion cooling applications include fluorinated fluids, mineral oils, silicone-based fluids, and synthetic hydrocarbons.

Fluorinated fluids, such as NOVEC™ (3M™) and GALDEN® (Solvay), are some of the most well-known and widely used cooling fluids in immersion cooling systems due to their dielectric properties and high thermal stability. These fluids are effective at providing electrical insulation and heat management, making them suitable for sensitive electronics and environments where fire hazards must be minimized. However, despite their technical advantages, fluorinated fluids have several limitations, including high costs, environmental concerns, and supply chain vulnerabilities. Fluorinated fluids are expensive, ranging from $100 to $300 per liter, which significantly raises the operational expenses for data centers, industrial cooling systems, and high-performance computing clusters. The cost factor impedes widespread adoption of fluorinated fluids, particularly with respect to small and mid-sized operations, as well as large-scale deployments such as cryptocurrency mining farms. Fluorinated fluids have a high global warming potential and are non-biodegradable. Their use raises serious sustainability issues, particularly as industries across the globe increasingly seek to reduce their carbon footprints and comply with stringent environmental regulations. The long-term impact of fluorinated fluids on ecosystems and waste management is an ongoing challenge. With respect to supply chains, the production of fluorinated fluids relies on specialized chemical production. Global disruptions in chemical production and transport, along with geopolitical factors affecting access to fluorinated chemicals, further increase costs and limits availability. Such issues lead to operational delays and increased dependence on a narrow supply base, making it difficult for industries to scale their operations smoothly.

Mineral oils are another conventional fluid commonly used for immersion cooling, primarily due to their low cost and widespread availability. Mineral oils are non-conductive and can be used for applications where cost-effective cooling is more important than achieving maximum thermal performance. Despite these advantages, mineral oils have several drawbacks, including low thermal conductivity, moderate oxidative stability, and environmental challenges. Mineral oils have a thermal conductivity of only 0.12 W/m·K to 0.13 W/m·K, which is far lower than thermal conductivities suitable for high-performance computing systems, particularly in AI-driven environments where rapid heat dissipation is essential. Their low thermal conductivity makes mineral oils unsuitable for cooling large data centers, AI clusters, and cryptocurrency mining operations where the heat load is significantly higher. In addition, while mineral oils offer some stability in standard operations, mineral oils possess only moderate oxidative stability. Over time, exposure to heat and air causes mineral oils to degrade, leading to increased maintenance requirements and the need for more frequent fluid replacement. This degradation also causes sludge formation, which reduces the efficiency of heat transfer and requires costly cleaning and filtration systems. Mineral oils, while less damaging than fluorinated fluids, pose environmental challenges due to their limited biodegradability. In industries with strict environmental regulations, the disposal and handling of large quantities of used mineral oil present logistical and environmental concerns.

Silicone-based fluids and synthetic hydrocarbons (such as conventional polyisobutylene (cPIB)) represent two other conventional fluids commonly used for immersion cooling. Silicone-based fluids and synthetic hydrocarbons provide good dielectric properties and oxidative stability, making them suitable for cooling sensitive electronic components in environments such as data centers and industrial electronics cooling systems. However, silicone-based fluids and synthetic hydrocarbons have various drawbacks including moderate thermal conductivity and price-to-performance ratio. Thermal conductivities of silicone-based fluids and synthetic hydrocarbons are only moderate, typically ranging from 0.13 W/m·K to 0.15 W/m·K, which, while higher than mineral oils, is not sufficient for applications with high-heat loads, such as AI-driven workloads, edge computing, or high-density servers in data centers. Accordingly, silicone-based fluids and synthetic hydrocarbons do not offer the thermal performance necessary to keep up with the rapid heat generation in modern computing environments. While silicone-based fluids and synthetic hydrocarbons can be less expensive than fluorinated fluids, they are more costly than mineral oils, which limits their use in large-scale operations where cost efficiency is a factor. Accordingly, the price-to-performance ratio of silicone-based fluids and synthetic hydrocarbons makes them less attractive when considering the increasing demands of modern high-performance computing systems.

In single-phase immersion cooling, cooling fluids remain in a liquid state throughout the cooling process. Such a system is favored for its simplicity and ease of maintenance compared to more complex cooling architectures such as two-phase immersion cooling systems. Single-phase immersion cooling systems may be used in applications where steady heat dissipation is useful without the need for advanced heat cycling. However, the limited thermal performance of conventional cooling fluids used in single-phase immersion cooling reduces their effectiveness in handling high-performance computing environments. Moreover, conventional cooling fluids for single-phase immersion cooling suffer from other drawbacks including low thermal conductivity, low heat dissipation capacity, and ease of degradation. For example, cooling fluids commonly used in single-phase immersion cooling often lack the thermal conductivity and heat dissipation capacity to manage the substantial heat generated in AI systems, data centers, and cryptocurrency mining farms. This limits their ability to prevent thermal hotspots in densely packed electronics, reducing overall system efficiency. Conventional cooling fluids used in single-phase systems degrade quickly, especially under continuous high-temperature operation. This degradation affects the cooling fluid's ability to dissipate heat effectively, leading to frequent fluid replacement and increased maintenance costs. Additionally, the degradation results in chemical by-products that negatively affect the electronics or the cooling system itself.

To overcome various deficiencies with conventional technologies, the inventors have discovered heat transfer compositions that include HR-PIB as a base fluid. The heat transfer compositions may optionally include another base fluid. The heat transfer compositions may optionally include one or more additives such as a thermally conductive material, a phase transition additive, an antioxidant, a surfactant, or combinations thereof, among other additives.

Relative to conventional fluorinated fluids, HR-PIB has several advantages, including lower production costs and a lower environmental impact. Further, HR-PIB has improved thermal conductivity, improved oxidative stability, and a lower environmental impact relative to conventional mineral oils. In addition, relative to conventional silicone-based fluids and conventional synthetic hydrocarbons, HR-PIB has improved thermal conductivity and improved price-to-performance ratio.

HR-PIB offers several advantages over conventional polyisobutylene (cPIB) when used in immersion cooling fluids, primarily due to its improved molecular structure, which allows for enhanced performance in thermal management, oxidation resistance, and fluid stability. Various non-limiting advantages of HR-PIB over cPIB for immersion cooling applications may include one or more of the following:

(a) HR-PIB has a higher content of reactive terminal double bonds compared to cPIB, which makes HR-PIB more versatile for chemical modification. This improved reactivity may allow for better formulation flexibility. For example, HR-PIB is more easily modified with additives such as thermally conductive materials and phase transition additives such as encapsulated materials, thereby enhancing the performance of the overall immersion fluid. In addition, HR—PIB is more resistant to oxidation and thermal degradation, making it more suitable for continuous-use environments such as data centers and industrial-scale cryptocurrency mining. This stability leads to fewer breakdowns of the fluid over time, reducing the need for frequent replacement of the fluid and lowering operational costs relative to cPIB.

(b) HR-PIB has a lower viscosity compared to cPIB, which is useful for immersion cooling fluids as viscosity directly affects the flow characteristics. For example, a lower viscosity may enable better circulation of compositions described herein around electronic components and more effective heat dissipation relative to conventional fluids including cPIB. This ability may help ensure that heat is transferred away from critical areas more efficiently, maintaining targeted/improved operating temperatures in AI-driven systems and high-performance computing environments. In addition, and relative to conventional cooling fluids such as cPIB, the reduced viscosity of HR-PIB may help compositions described herein to flow more easily through complex geometries in immersion cooling systems, such as densely packed electronic boards, which improves overall cooling performance.

(c) HR-PIB also exhibits better thermal stability at high temperatures compared to cPIB. For example, HR—PIB is less prone to thermal degradation than cPIB, which is a common issue in high-heat environments. This makes HR-PIB more durable in applications where continuous operation is useful, helping to maintain consistent performance over long periods. The superior thermal stability of HR-PIB translates into a longer fluid lifespan, reducing the frequency of maintenance of electronic components and replacement of the immersion cooling fluid, which is an advantage in continuous-use environments.

(d) The molecular structure of HR-PIB allows it to bond more effectively with additives such as carbon-based materials, metal-based materials, encapsulated phase change materials (PCMs), and non-encapsulated PCMs, among other additives described herein. For example, HR-PIB provides better compatibility with non-encapsulated nanoparticles such as copper, silver, and graphene, ensuring that the non-encapsulated nanoparticles remain well-dispersed throughout the fluid, which enhances thermal conductivity, overall cooling performance, or both. By interacting more effectively with thermally conductive materials, HR-PIB may help maintain the electrical insulation properties of immersion cooling compositions while improving heat dissipation.

(e) HR-PIB's enhanced chemical structure leads to reduced sludge formation compared to cPIB. Sludge formation is a major issue in cPIB-containing fluids as it clogs cooling systems and reduces heat transfer efficiency. HR-PIB's superior stability and resistance to oxidation may help prevent, or at least mitigate, such buildup, ensuring cleaner operation and reducing the need for frequent maintenance. The reduced likelihood of sludge formation by using HR-PIB containing fluids may directly translate into lower maintenance requirements, a longer service life, or both for immersion cooling systems.

(f) HR-PIB offers various environmental advantages over cPIB. For example: HR-PIB is more biodegradable and may be manufactured in ways that are more environmentally friendly, aligning with the increasing focus on sustainable solutions in industries such as green data centers. Due to HR-PIB's enhanced durability, systems using HR-PIB-containing fluids need less frequent fluid replacement, which reduces the overall environmental impact from the production, disposal, and recycling of immersion cooling fluids.

(g) Manufacturing advantages of HR-PIB over cPIB. An advantage of HR-PIB over cPIB is how HR-PIB is made, not just HR-PIB's high alpha vinylidene content. For example, even when the alpha vinylidene content of HR-PIB is less than 75 wt %, HR-PIB outperforms cPIB due to, for example, HR-PIB's narrow molecular weight distribution and the lack of organic chloride residues that come from the $AlCl_3$ process to make cPIB. HR-PIB may be prepared using any suitable catalyst, such as alkylaluminum halides, ionic liquids, boron halides, and the catalyst may be solid or liquid. An illustrative, but non-limiting, catalyst for making HR-PIB may include a $BF_3$ complex catalyst.

cPIB, in contrast to HR-PIB described herein, does not meet the proposed Open Compute Project (OCP) proposed specifications for immersion cooling fluids. Further cPIB-based fluids they are burdened by impurity-related issues, particularly organic chloride residues from the $AlCl_3$ catalyst used in production. These impurities are extremely difficult, if not impossible, to fully eliminate, resulting in poor dielectric properties that make cPIB unsuitable for immersion cooling applications. This contamination issue likely explains why no form of PIB—whether HR-PIB, cPIB, or otherwise—has historically been considered for immersion cooling fluids. Because cPIB fails to meet the necessary performance standards, the potential of HR-PIB as a viable high-performance immersion cooling fluid has never been explored until now.

Relative to conventional fluids including cPIB, these factors make HR-PIB a more effective liquid for immersion cooling, such as in high-performance and continuous-use environments, such as data centers, AI-driven systems, and cryptocurrency mining operations.

Over time, synthetic hydrocarbons have become the preferred immersion cooling fluids, with polyalphaloefins (PAOs) leading the industry. However, PAOs are expensive and HR-PIB is significantly more cost-effective. Emerging candidates include acyclic paraffinic oils such as gas-to-liquid fluids and hydroisomerized alpha-olefins. PIB is also a synthetic hydrocarbon and is significantly more cost-effective than PAO.

To the inventors' knowledge, there is no known use of HR-PIB for use as a single-phase immersion cooling fluid or heat transfer composition. Some research has looked into the use additized synthetic isoparaffinic hydrocarbons for immersion cooling. The research also generalizes the inclusion of all synthetic hydrocarbons, including polyisobutylene, but fails to specifically observe, describe, demonstrate, or substantiate the viability of HR-PIB as a base fluid. Other conventional technologies focus on isoparaffinic oils, fluorinated hydrocarbons, and other synthetic hydrocarbons, none of which offer the specific benefits of HR-PIB in immersion cooling applications. This underscores that HR-PIB represents a fundamentally novel and superior dielectric fluid for immersion cooling, offering distinct advantages over conventional fluids. The uniqueness of HR-PIB includes its structural consistency, cost efficiency, and its improved balance of viscosity with dielectric properties.

A key differentiator is the olefinic structure of HR-PIB, which, despite conventional expectations, demonstrates excellent oxidative stability to serve as a high-performance cooling fluid without requiring full saturation or hydrogenation. This contradicts the prevailing assumption that only fully saturated hydrocarbons or fluorinated compounds are viable immersion cooling fluids. Here, the conventional wisdom is that olefin containing polymers are unstable. However, the inventors found that even with the olefin, the HR-PIB fluid is stable. That is, the inventors unexpectedly discovered that HR-PIB, despite being an olefin, exhibits sufficient stability to be used directly as a base fluid in immersion cooling applications. Conventional understanding suggests that olefinic hydrocarbons are prone to oxidative degradation and may require additional chemical modification, such as hydrogenation, to improve stability. However, HR-PIB has been found to possess oxidative stability for immersion cooling, even in the absence of full hydrogenation. This represents a significant and previously unrecognized advantage, particularly in terms of cost efficiency and performance improvement for immersion cooling fluids.

As described above, polyisobutylene has been researched as a potential component of immersion cooling fluids and heat transfer fluids. However, the polyisobutylenes conventionally used are not HR-PIB, in contrast to aspects described herein. HR-PIB is a highly reactive polyisobutylene (with terminal vinylidene content, i.e., alpha vinylidene groups). No olefin-based fluids, including HR-PIB, have been described or used in conventional heat transfer compositions, immersion cooling fluids, or thermal management compositions. This is because, as described herein, conventional understanding suggests that olefinic hydrocarbons are prone to oxidative degradation and may require additional chemical modification, such as hydrogenation, to improve stability.

In further contrast to conventional technologies, HR-PIB has never been used as a standalone heat transfer composition, immersion cooling fluid, or thermal management composition, and has never been used as a standalone base fluid for heat transfer compositions, immersion cooling fluids, and thermal management compositions. Instead, conventional technologies utilize blends that include halogenated hydrocarbons or isoparaffinic oils as base fluids. Halogenated hydrocarbons are structurally and functionally different from HR-PIB based compositions described herein. Isoparaffinic oils used in conventional cooling fluids refer to fully saturated hydrocarbons, meaning conventional compositions require saturated fluids rather than reactive or unsaturated olefinic structures. HR-PIB, as a highly reactive polyisobutylene (with terminal vinylidene content), is an olefin and is not saturated, and is therefore not an isoparaffinic oil.

In addition, polyisobutylene made by conventional methods (such as with liquid boron trifluoride ($BF_3$) and aluminum trichloride ($AlCl_3$) catalysts) include a majority of olefin isomers (greater than 50 wt %) that are not alpha vinylidene olefin isomers. Such polyisobutylene products are known as cPIB as described herein and HR-PIB is structurally, functionally, chemically, and physically distinct from cPIB. Further, the polyisobutylenes made by conventional methods and used in conventional compositions have impurity-related issues, including halogen residues from the $AlCl_3$ or $BF_3$ catalyst used during production. In addition, the polyisobutylene made by these methods and used as potential immersion cooling fluids are made using butylenes. Because butylenes are in the feedstream, the polyisobutylene produced contains significant amounts, typically up to 25%, of normal butylene moieties in the polymer chain. Technically and chemically, these polymers are not polyisobutylene but are more correctly polybutylenes (PB).

Overall, no HR-PIB based heat transfer compositions, thermal management compositions, or immersion cooling fluids have been described to date. In addition, no HR-PIB based heat transfer compositions, thermal management compositions, or immersion cooling fluids have been used in, for example, data centers or electric vehicle (EV) thermal management systems.

As described herein, compositions of the present disclosure includes HR-PIB, providing for superior thermal and electrical performance. Alternatively, compositions of the present disclosure may include (a) HR-PIB; (b) an optional additional base fluid; and (c) an optional additive for superior thermal and electrical performance. Each of these compositions are high-performance immersion cooling compositions that, for example, address various limitations of existing cooling technologies. With respect to the optional additional base fluids, the optional additives, or combinations thereof, compositions described herein may have additional benefits including one or more of the following:

(a) The inclusion of the optional thermally conductive materials, such as metal-based particles, carbon-based particles, or both may significantly enhance heat dissipation relative to conventional fluids, making compositions described herein suitable for high-performance computing environments where efficient thermal management is useful.

(b) The inclusion of the optional additional base fluids, optional additives, or both in compositions of the present disclosure, may improve the electrical insulation properties relative to conventional fluids, making it suitable for cooling sensitive electronic components in high-voltage and AI-driven systems.

(c) The use of biodegradable polyol esters as an optional base fluid or optional additive, as well as the use of an optional encapsulated phase change material may help ensure that compositions described herein meet stringent environmental regulations, making them suitable for industries that prioritize sustainability, such as green data centers.

(d) The incorporation of surfactants as optional additives may help ensure that other components present in compositions described herein, such as thermally conductive materials in particle form, among other components, remain uniformly (or substantially uniformly) dispersed, reducing the need for maintenance and ensuring long-term stability in continuous-use environments.

The use of headings is for purposes of convenience only and does not limit the scope of the present disclosure. Aspects described herein may be combined with other aspects.

Compositions

Aspects of the present disclosure generally relate to a new class of compositions for immersion cooling. Such compositions are referred to herein as immersion cooling compositions, immersion cooling fluid compositions, thermal management compositions, heat transfer compositions, heat management compositions, or coolants. These terms may be used interchangeably unless specified to the contrary or the context clearly indicates otherwise. As used herein, a "composition" may include component(s) of the composition, reaction product(s) of two or more components of the composition, a remainder balance of remaining starting component(s), or combinations thereof. Compositions of the present disclosure may be prepared by any suitable mixing process.

Compositions of the present disclosure may be utilized for single-phase immersion cooling. In single-phase immersion cooling, for example, heat-generating electronic components (such as integrated circuit components) may be immersed in an immersion cooling fluid that is in a liquid state before the immersion cooling fluid is heated by the immersed components. In single-phase immersion cooling, the immersion cooling fluid remains in its liquid state as it is heated under expected operating conditions. HR-PIB described herein is particularly suitable for single-phase immersion cooling applications. This is primarily due to their high boiling point, which exceeds the temperature range for efficient phase transition in two-phase immersion cooling.

Compositions described herein include a base fluid and optionally one or more additional components.

The base fluid includes HR-PIB. The HR-PIB may be in the form of a composition. HR-PIB includes greater than about 75 wt % alpha vinylidene olefin isomer. HR-PIB described herein may contain additional olefin isomers including beta vinylidene olefin isomer, other trisubstituted olefin isomers, internal vinylidenes, and tetrasubstituted olefin isomers. HR-PIB is termed highly reactive because of its increased reactivity in derivatization reactions. In contrast, conventional PIB (cPIB) has a majority of its olefin isomers other than alpha vinylidene. cPIB typically has 10% or less of alpha vinylidene olefin isomer.

The alpha vinylidene olefin isomer (also referred to as α-vinylidene) of HR-PIB has the following structure represented by formula (IA):

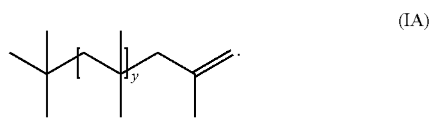

(IA)

As shown in formula (IA), the alpha vinylidene olefin isomer has the double bond (or olefin) positioned in the terminal position of the molecule, allowing it to react more quickly when producing derivatives. As described herein, HR-PIB includes greater than about 75% alpha vinylidene olefin isomer.

The beta vinylidene olefin isomer (also referred to as β-vinylidene) has the following structure represented by formula (IB):

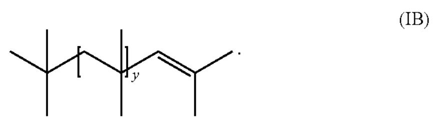

(IB)

An internal disubstituted vinylidene olefin isomer of a PIB composition (or HR-PIB composition) includes the following structure represented by formula (IC):

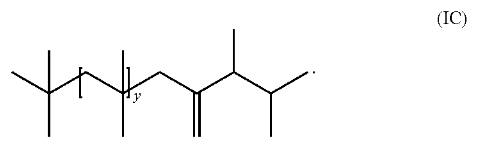

(IC)

Other internal vinylidenes are possible, including where the position of the olefin in the polyisobutylene is such that the olefin is disubstituted and not at the end of the carbon chain. Other trisubstituted olefin isomers and tetrasubstituted olefin isomers may be produced in the polymerizations described herein.

The HR-PIB useful for compositions described herein may include a first portion comprising polymer chains having alpha vinylidene groups (alpha vinylidene olefin isomers), a second portion comprising polymer chains having beta vinylidene groups (beta vinylidene olefin isomers), and a third portion comprising polymer chains having internal vinylidene groups that are not beta vinylidene groups (internal vinylidene olefin isomers).

The HR-PIB may be a PIB where:

(a) an amount of the first portion comprising polymer chains having alpha vinylidene groups may be 75 wt % or more, such as about 80 wt % or more, such as about 82 wt % or more, such as about 85 wt % or more, such as about 87 wt % or more, such as about 90 wt % or more, such as about 92 wt % or more, such as about 94 wt % or more, such as about 95 wt % or more, such as about 98 wt % or more, such as about 99 wt % or more, such as 100 wt % based on a total wt % of the first portion, the second portion, and the third portion of the HR-PIB, the total wt % of the first portion, the second portion, and the third portion of the HR-PIB is equal to 100 wt %.

(b) a total amount of the second portion comprising polymer chains having beta vinylidene groups plus the third portion comprising polymer chains having internal vinylidene groups that are not internal vinylidene groups may be 25 wt % or less, such as about 20 wt % or less, such as about 18 wt % or less, such as about 15 wt % or less, such as about 13 wt % or less, such as about 10 wt % or less, such as about 8 wt % or less, such as about 6 wt % or less, such as about 5 wt % or less, such as about 2 wt % or less, such as about 1 wt % or less, such as about 0 wt % based on the total wt % of the first portion, the second portion, and the third portion of the HR-PIB.

The HR-PIB of the base fluid may have any suitable number-average molecular weight (Mn), such as an Mn in a range from about 150 g/mol to about 600 g/mol, such as from about 168 g/mol to about 560 g/mol, such as from about 180 g/mol to about 500 g/mol, such as from about 220 g/mol to about 480 g/mol, such as from about 280 g/mol to about 450 g/mol, such as from about 300 g/mol to about 400 g/mol, such as from about 320 g/mol to about 370 g/mol, such as from about 320 g/mol to about 350 g/mol, or from about 250 g/mol to about 450 g/mol, such as from about 280 g/mol to about 400 g/mol.

The HR-PIB of the base fluid may have any suitable number of carbon atoms. For example, the HR-PIB may include from about 12 carbon atoms to about 40 carbon atoms, such as from about 14 carbon atoms to about 36 carbon atoms, such as from about 20 carbon atoms to about 32 carbon atoms, such as from about 24 carbon atoms to about 28 carbon atoms, or from about 12 carbon atoms to about 36 carbon atoms, such as from about 16 carbon atoms to about 32 carbon atoms, such as from about 20 carbon atoms to about 28 carbon atoms, or from about 20 carbon atoms to about 30 carbon atoms. The HR-PIB may include a C12-C40 HR-PIB, such as a C14-C36 HR-PIB, such as a C20-C32 HR-PIB, such as a C24-C28 HR-PIB, or a C12-C36 HR-PIB, such as a C16-C32 HR-PIB, such as a C20-C28 HR-PIB, or a C20-C32 HR-PIB, or a C20-C24 HR-PIB, or a C24-C28 HR-PIB, or a C28-C36 HR-PIB, or a C20 HR-PIB, or a C24 HR-PIB, or a C28 HR-PIB, or a C32 HR-PIB, or a C36 HR-PIB.

The HR-PIB of the composition may include one or more HR-PIBs. For example, a C20-C28 HR-PIB may include a C20 HR-PIB, a C24 HR-PIB, and/or a C28 HR-PIB in any suitable proportions, for example, in a proportion such that the HR-PIB has a KV40 of less than 10 cSt and flash point is greater than 150° C. As another example, a C16-32 HR-PIB may include a C16 HR-PIB, a C20 HR-PIB, a C24 HR-PIB, a C28 HR-PIB, a C32 HR-PIB, or combinations thereof, in any suitable proportions.

In some aspects, which may be combined with other aspects, a mixture of two HR-PIBs may include a weight ratio of a first HR-PIB to a second HR-PIB that may be in a range from about 0.1:0.9 to about 0.9:0.1, such as from about 0.2:0.8 to about 0.8:0.2, such as from about 0.3:0.7 to about 0.7:0.3, such as from about 0.4:0.6 to about 0.6:0.4, such as from about 0.45:0.55 to about 0.55:0.45 (first HR-PIB:second HR-PIB), where the first HR-PIB and the second HR-PIB are different HR-PIBs, for example a C24 HR-PIB and a C28 HR-PIB.

In some aspects, which may be combined with other aspects, a mixture of three HR-PIBs may include any suitable proportions. For example, a mixture of three HR-PIBs may include:

(a) an amount of the first HR-PIB that may be may be in a range from greater than 0 wt % to about 98 wt %, such as from greater than 0 wt % to about 95 wt %, such as from about 1 wt % to about 90 wt %, such as from about 10 wt % to about 80 wt %, such as from about 20 wt % to about 70 wt %, such as from about 30 wt % to about 60 wt %, such as from about 40 wt % to about 50 wt %, or in a range from greater than 0 wt % to about 34 wt %, such as from about 5 wt % to about 30 wt %, such as from about 10 wt % to about 25 wt %, such as from about 15 wt % to about 20 wt % based on a total wt % of the first HR-PIB, the second HR-PIB, and the third HR-PIB, the total wt % of the first HR-PIB, the second HR-PIB, and the third HR-PIB equal to 100 wt %;

(b) an amount of the second HR-PIB that may be may be in a range from greater than 0 wt % to about 98 wt %, such as from greater than 0 wt % to about 95 wt %, such as from about 1 wt % to about 90 wt %, such as from about 10 wt % to about 80 wt %, such as from about 20 wt % to about 70 wt %, such as from about 30 wt % to about 60 wt %, such as from about 40 wt % to about 50 wt %, or in a range from greater than 0 wt % to about 34 wt %, such as from about 5 wt % to about 30 wt %, such as from about 10 wt % to about 25 wt %, such as from about 15 wt % to about 20 wt % based on the total wt % of the first HR-PIB, the second HR-PIB, and the third HR-PIB; and (c) an amount of the third HR-PIB that may be in a range from greater than 0 wt % to about 98 wt %, such as from greater than 0 wt % to about 95 wt %, such as from about 1 wt % to about 90 wt %, such as from about 10 wt % to about 80 wt %, such as from about 20 wt % to about 70 wt %, such as from about 30 wt % to about 60 wt %, such as from about 40 wt % to about 50 wt %, or in a range from greater than 0 wt % to about 34 wt %, such as from about 5 wt % to about 30 wt %, such as from about 10 wt % to about 25 wt %, such as from about 15 wt % to about 20 wt % based on the total wt % of the first HR-PIB, the second HR-PIB, and the third HR-PIB.

The HR-PIB of the base fluid may have any suitable ratio of Mw/Mn (weight-average molecular weight divided by number-average molecular weight), such as in a range from greater than 1.0 to about 2.0, such as from about 1.05 to about 2.0, such as from about 1.15 to about 1.85, such as from about 1.3 to about 1.7, such as from about 1.4 to about 1.6, such as about 1.5, or from about 1.0 to about 1.7, such as from about 1.1 to about 1.6, such as from about 1.2 to about 1.5, such as from about 1.3 to about 1.4, such as about 1.3 or about 1.4, or in a range from about 1.0 to about 1.5, such as from about 1.0 to about 1.2, such as from about 1.0 to about 1.1, such as from about 1.0 to about 1.05. Mw/Mn is also referred to as PDI. Measurement of Mw and Mn is described in the Examples Section.

The HR-PIB of the base fluid may have any suitable specific heat capacity. For example, the HR-PIB of the base fluid may have a specific heat capacity of about 1.8 J/g·K or more, such as in a range from about 1.8 J/g·K to about 2.4 J/g·K, such as from about 2.0 J/g·K to about 2.3 J/g·K, such as from about 2.1 J/g·K to about 2.3 J/g·K, such as from about 2.2 J/g·K to about 2.25 J/g·K, or in a range from about 1.9 J/g·K to about 2.3 J/g·K, such as from about 2 J/g·K to about 2.2 J/g·K. Measurement of specific heat capacity is described in the Examples Section.

The HR-PIB of the base fluid may have any suitable breakdown voltage. For example, the HR-PIB of the base fluid may have a breakdown voltage in a range from about 40 kV to about 60 kV, such as from about 45 kV to about 55 kV, such as from about 47 kV to about 51 kV. Measurement of breakdown voltage is described in the Examples Section.

The HR-PIB of the base fluid may have any suitable dielectric strength. For example, the HR-PIB of the base fluid may have a dielectric strength of about 5 kV/mm or more, such as about 10 kV/mm or more, such as about 20 kV/mm or more, or about 30 kV/mm or more, about 40 kV or more, such as about 50 kV or more, etc., and up to about 100 kV/mm or less, such as about 80 kV/mm or less, such as about 70 kV/mm or less, such as about 60 kV/mm or less, such as about 50 kV/mm or less, etc. Measurement of dielectric strength is described in the Examples Section.

The HR-PIB of the base fluid may have any suitable electrical resistivity. For example, the HR-PIB of the base fluid may have an electrical resistivity of about $1\times10^9$ Ω·cm or more, such as in a range from about $1\times10^9$ Ω·cm to about $9.9\times10^{14}$ Ω·cm, such as from about $1\times10^{11}$ Ω·cm to about $9.9\times10^{14}$ Ω·cm, such as from about $1\times10^{11}$ Ω·cm to about $9.9\times10^{13}$ Ω·cm. Measurement of electrical resistivity is described in the Examples Section.

The HR-PIB of the base fluid may have any suitable dielectric constant. For example, the HR-PIB of the base fluid may have a dielectric constant of about 3.5 or less, such as about 3.2 or less, such as about 3.0 or less, such as about 2.5 or less, such as about 2.3 or less (with a minimum of about 1.0), such as in a range from about 1.9 to about 2.5, such as from about 2.0 to about 2.4, such as from about 2.1 to about 2.3, such as about 2.2. Measurement of dielectric constant is described in the Examples Section.

The HR-PIB of the base fluid may have any suitable thermal conductivity. For example, the HR-PIB of the base fluid may have a thermal conductivity of about 0.12 W/m·K or more, such as in a range from about 0.12 W/m·K to about 0.20 W/m·K, such as from about 0.14 W/m·K to about 0.18 W/m·K, such as from about 0.15 W/m·K to about 0.16 W/m·K. Measurement of thermal conductivity is described in the Examples Section.

The HR-PIB of the base fluid may have any suitable kinematic viscosity at 40° C. (KV40). For example, the HR-PIB of the base fluid may have a KV40 of about 150 centistokes (cSt) or less, such as in a range from about 1 cSt to about 150 cSt, such as from about 10 cSt to 125 cSt, such as from about 20 cSt to 100 cSt, such as from about 30 cSt to 75 cSt, or from about 1 cSt to about 50 cSt, such as from about 1 cSt to about 30 cSt, such as from about 5 cSt to about 25 cSt, such as from about 10 cSt to about 20 cSt, or from about 1 cSt to about 20 cSt, such as from about 2 cSt to about 20 cSt, such as from about 3 cSt to about 10 cSt. Measurement of KV40 is described in the Examples Section.

The HR-PIB of the base fluid may have any suitable kinematic viscosity at 100° C. (KV100). For example, the HR-PIB of the base fluid may have a KV100 of about 20 cSt or less, such as in a range from about 1 cSt to about 20 cSt, such as from about 1 cSt to about 15 cSt, such as from about 1 cSt to about 10 cSt, such as from about 1.5 cSt to about 5 cSt, such as from about 1.7 cSt to about 4 cSt, such as from about 2 cSt to about 3.5 cSt. Measurement of KV100 is described in the Examples Section.

The HR-PIB of the base fluid may have any suitable electrical conductivity. For example, the HR-PIB of the base fluid may have an electrical conductivity of less than 0.15 picosiemens per meter (pS/m), such as less than 0.12 pS/m, such as less than 0.10 pS/m. Measurement of electrical conductivity is described in the Examples Section.

The HR-PIB of the base fluid may have any suitable viscosity index. For example, the HR-PIB of the base fluid may have a viscosity index in a range from about 60 to about 110, such as from about 70 to about 100, such as from about 75 to about 95. Measurement of viscosity index is described in the Examples Section.

The HR-PIB of the base fluid may have any suitable flash point. For example, the HR-PIB of the base fluid may have a flash point of about 115° C. or more, such as about 125° C. or more, such as about 150° C. or more, or in a range from about 115° C. to about 250° C., such as from about 125° C. to about 225° C., such as from about 135° C. to about 200° C. such as from about 145° C. to about 175° C., such as from about 145° C. to about 155° C., such as about 150° C. Measurement of flash point is described in the Examples Section.

The HR-PIB of the base fluid may have any suitable pour point. For example, the HR-PIB of the base fluid may have a pour point of about −30° C. or less (more negative), such as about −40° C. or less, such as about −50° C. or less, such as about −60° C. or less, or in a range from about −70° C. to about −30° C., such as from about −60° C. to about −40° C., such as about −50° C. Measurement of pour point is described in the Examples Section.

The HR-PIB of the base fluid may have any suitable specific gravity. For example, the HR-PIB of the base fluid may have a specific gravity of about 0.79 g/cm$^3$ or more, about 0.9 g/cm$^3$ or less, or a combination thereof, such as in a range from about 0.795 g/cm$^3$ to about 0.845 g/cm$^3$, such as from about 0.80 g/cm$^3$ to about 0.84 g/cm$^3$, such as from about 0.82 g/cm$^3$ to about 0.84 g/cm$^3$. Measurement of specific gravity is described in the Examples Section.

Illustrative, but non-limiting, examples of HR-PIB that may be used include those made according to processes described in, for example, U.S. Pat. Nos. 11,124,585, 11,174,206, 11,214,637, 12, 116,426, or 12,264,208, each of which is herein incorporated by reference in their entirety. One or more HR-PIBs may be utilized as base fluids of compositions described herein.

Base fluids of compositions described herein may further include one or more optional base fluids. Optional base fluids useful with compositions of the present disclosure may include a polyalphaolefin (PAO), a synthetic ester, a bio-derived ester, a gas-to-liquids (GTL) fluid, an isoparaffin, a polysiloxane (such as a modified polysiloxane), a silicone, a Group II base oil, a Group III base oil, or combinations thereof. The HR-PIB, PAO, synthetic ester, bio-derived ester, GTL fluid, isoparaffin, polysiloxane, silicone, Group II base oil, and Group III base oil are different base fluids.

PAOs may be optionally utilized to alter thermal stability and/or alter electrical conductivity of compositions described herein. Any suitable PAO may be optionally utilized as a portion of the base fluid of compositions described herein. PAOs may include those made from C10-C12 monomers such as decene and dodecene monomers.

Suitable PAOs may be dimers, trimers, tetramers, or combinations thereof. For example, the PAO may have a kinematic viscosity (at 100° C.) in a range from about 1 cSt to about 10 cSt. Commercially available PAOs useful with compositions described herein may include PAO-2 (kinematic viscosity at 100° C. of 1.71 cSt), PAO-4 (kinematic viscosity at 100° C. of 3.84 cSt), PAO-6 (kinematic viscosity at 100° C. of 5.86 cSt), or combinations thereof, such as those sold under the tradename SYNFLUID™ from Chevron Phillips Chemical Company. Other commercially available and useful PAOs may include: SPECTRASYN™ PAOs from ExxonMobil (such as SPECTRASYN™ 2, SPECTRASYN™ 2B, SPECTRASYN™ 4, SPECTRASYN 5, SPECTRASYN™ 6, SPECTRASYN™ 8, or SPECTRASYN™ 10); SPECTRASYN ELITE™ PAOs from ExxonMobil (such as SPECTRASYN ELITE™ 65, SPECTRASYN ELITE™ 150, or SPECTRASYN ELITE™ 300); and DURASYN® PAOs from Ineos (such as DURASYN® 162, DURASYN® 164, DURASYN® 166, DURASYN® 168, DURASYN® 170, DURASYNR 1741, DURASYN® 176, DURASYN® 180R, DURASYN® 180I, or DURASYN® 185). One or more PAOs may be utilized as part of base fluids of compositions described herein.

Synthetic esters and bio-derived esters may be utilized to alter dielectric properties and/or improve environmental benefits of compositions described herein. Any suitable synthetic ester, bio-derived ester, or combination thereof may be optionally utilized as a portion of the base fluid of compositions described herein. For example, the synthetic ester, bio-derived ester, or combination thereof may include a monoester, a diester, a polyol ester, or combinations thereof. Examples of synthetic esters may include, but are not limited to: those sold under the tradename PRIOLUBE™ from Cargill (such as PRIOLUBE™ EF 7010, PRIOLUBE™ EF 3446, or PRIOLUBE™ EF 3221); DEHYLUB® from Emery Oleochemicals (such as DEHYLUB® 4003, DEHYLUB® 5005, DEHYLUB® 5010, DEHYLUB® 5015, DEHYLUB® 5020, or DEHYLUB® 5025); HATCOL® esters from Lanxess (such as HATCOL® 2906, HATCOL® 2910, HATCOLR 3110, HATCOL® 2925, or HATCOL® 2938); SYNMERSE™ esters (a polyol ester) from Perstorp (such as SYNMERSE™ DC); MIDEL™ esters from Shell (such as MIDEL™ 7131); and synthetic HYVOLT® esters commercially available from Ergon (for example, HYVOLT® SE) are illustrative, but non-limiting, example of synthetic esters that may be used with compositions described herein. HYVOLT® SE includes greater than 99.5% fatty acid tetra esters (polyol ester). DEHYLUB® 4003 is a low viscosity monoester that includes 2-ethylhexyl laurate (KV40 from about 4 cSt to about 6 cSt). One or more synthetic esters may be utilized as part of base fluids of compositions described herein.

Bio-derived esters may be derived from vegetable oils. Illustrative, but non-limiting, examples of vegetable oils may include those derived from soybean oil, canola oil, corn oil, sunflower oil, or combinations thereof. Bio-derived HYVOLT® esters commercially available from Ergon (for example, HYVOLT® NE) are illustrative, but non-limiting, examples of bio-derived esters that may be used with compositions described herein. HYVOLT® NE includes greater than 99% vegetable oil. Vegetable oils may include triglycerides. One or more bio-derived esters may be utilized as part of base fluids of compositions described herein.

HR-PIB is a significantly lower-cost alternative compared to PAO and ester-based fluids. The use of HR-PIB in the form of a blend with PAO or ester-based fluids provides a composition that maintains high-performance standards while offering significant economic advantages. This makes HR-PIB an attractive option for scaling immersion cooling technologies, particularly in cost-sensitive applications such as hyperscale data centers and EV power electronics cooling.

Isoparaffinic fluids may be used to alter the thermal performance and/or oxidation resistance of compositions described herein. GTL fluids are a specific type of isoparaffinic fluids. Any suitable isoparaffinic fluid or GTL fluid may be optionally utilized as a portion of the base fluid of compositions described herein. The isoparaffinic fluid or GTL fluid may be a fluid derived from the Fischer-Tropsch process. The isoparaffinic fluid or GTL fluid may include C8-C50 isoparaffins, such as C8-C26 isoparaffins, such as C14-C36 isoparaffins, such as C16-C32 isoparaffins, such C20-C30 isoparaffins, or C12-C25 isoparaffins. The isoparaffinic fluid or GTL fluid may further include optional C8-C50 normal paraffins, such as C8-C26 normal paraffins, such as C14-C36 normal paraffins, such as C16-C32 normal paraffins, such C20-C30 normal paraffins, or C12-C25 normal paraffins.

The isoparaffinic fluid or GTL fluid may include a weight ratio of C8-C50 isoparaffins to C8-C50 normal paraffins that is in a range from about 50:50 to about 99:1, such as from about 60:40 to about 95:5, such as from about 70:30 to about 90:10, such as from about 75:25 to about 85:15, such as about 80:20. Illustrative, but non-limiting, examples of isoparaffinic fluids and GTL fluids may include Shell's GTL fluids (such as GTL fluid G60, GTL fluid G80, GTL fluid G100); Shell's GS series of GTL fluids (such as GTL Solvent GS310); and ExxonMobil's ISOPAR™ fluids. One or more isoparaffinic fluids and/or GTL fluids may be utilized as part of base fluids of compositions described herein.

Any suitable isoparaffin may be optionally utilized as a portion of the base fluid. Isoparaffins useful as a base fluid may include isoparaffins only. The isoparaffins may include C8-C50 isoparaffins, such as C8-C26 isoparaffins, such as C14-C36 isoparaffins, such as C16-C32 isoparaffins, such C20-C30 isoparaffins, or C12-C25 isoparaffins. One or more isoparaffins may be utilized as part of base fluids of compositions described herein.

Any suitable Group II base oil, Group III base oil, or both, may be optionally utilized as a portion of the base fluid. Group II base oils and Group III base oils are broad categories of base oil stocks developed and defined by the American Petroleum Institute (API Publication 1509; www.API.org) to create guidelines for lubricant base oils. Group II base oils generally have a viscosity index in a range from about 80 to 120, and contain less than or equal to about 0.03% sulfur, and greater than or equal to about 90% saturates. Group III base oils generally have a viscosity index greater than about 120 and contain less than or equal to about 0.03% sulfur and greater than about 90% saturates. One or more Group II base oils may be utilized as part of base fluids of compositions described herein. One or more Group III base oils may be utilized as part of base fluids of compositions described herein.

When the base fluid of the composition includes more than one base fluid, any suitable volume ratio of base fluids may be utilized. For example, a volume ratio of first base fluid (HR-PIB) to second base fluid in the base fluid may be in a range from about 1:99 to about 99:1, such as from about 5:95 to about 95:5, such as from about 10:90 to about 90:10, such as from about 20:80 to about 80:20, such as from about 30:70 to about 70:30, such as from about 40:60 to about 60:40, or about 50:50 (HR-PIB:second base fluid), or in a range from about 50:50 to about 99:1, such as from about 60:40 to about 95:5, or from about 70:30 to about 90:10, or about 80:20 (HR-PIB:second base fluid), or in a range from about 1:99 to about 50:50, such as from about 5:95 to about 40:60, such as from about 10:90 to about 30:70, or about 20:80 (HR-PIB:second base fluid).

Other illustrative, but non-limiting, base fluids useful with compositions of the present disclosure may include one or more of the following:

(a) PAOs: Cooling Fluid DC-20 (PAO, Castrol); COMPUZOL™ IM2020 (PAO 2.5, Lubrizol); COMPUZOL™ IM2015 (PAO 2, Lubrizol); COMPUZOL™ IM2025 (PAO 5, Lubrizol); ELECTROCOOL® EC-110 (PAO 2, Engineered Fluids); ELECTROCOOL® EC-120 (PAO 4, Engineered Fluids); ELECTROCOOL® EC-130 (PAO 7, Engineered Fluids); ELECTROCOOL® EC-140 (PAO 10, Engineered Fluids); THERMASAFE™ R (PAO 2, DCX); EVOGEN™ TM1150 (PAO 2, Lubrizol); DC 1150 (PAO 2E, ExxonMobil); DC 1210 (PAO 6, ExxonMobil); DC 3220 (PAO 4, ExxonMobil); DC 3235 S (PAO 3.5 Max, ExxonMobil); DC 3152 (PAO 2, ExxonMobil); DC 3250 (PAO, ExxonMobil); Renolin FECC5 SYNTH (PAO 2, Fuchs); Alpha-2 (PAO 2, Soltex); SmartCoolant (PAO 2, Submer); SYNFLUID® 2 (PAO 2, Chevron Phillips Chemical); SYNFLUID® 4 (PAO 4, Chevron Phillips Chemical); SYNFLUID® 6 (PAO 6, Chevron Phillips Chemical); or combinations thereof.

(b) Group II and Group III base oils: Cooling Fluid DC-15 (Group II base oil, Castrol); Renolin FECC7 (Group II base oil, Fuchs); INNOVATE™ Peyto (Group II base oil, PetroCanada); INNOVATE™ Garda (Group II base oil, PetroCanada); INNOVATE™ Yarro (Group II base oil, PetroCanada); VALVOLINE® (Group III base oil, Aramco); Ultra 2 (Group III base oil, Aramco); or combinations thereof.

(c) Bio-derived esters: NATURECOOL™ 2000 (soybean oil, Cargill).

(d) Isoparaffin and isoparaffin-containing base fluids such as GTLs: THERMASAFE™ N (isoparaffin GTL, DCX); THERMASAFE™ S (isoparaffin GTL, DCX); EVOGEN™ TM1100 (C12 isoparaffin, Lubrizol); EVOGEN™ TM1070 (C10 isoparaffin, Lubrizol); S3 X (GTL fluid, Shell); or combinations thereof.

(e) Polysiloxanes (or modified polysiloxanes): DOWSIL™ ICL-1000 (modified polysiloxane, Dow); DOWSIL™ ICL-1100 (modified polysiloxane, Dow); or a combination thereof.

(f) Silicones: ED01 (silicone, Innochill).

(g) Miscellaneous: ELECTROSAFER® (mixture of various base fluids, Green Revolution Cooling); Phillips 66® 70 ISO Grade 10 Industrial Oil (paraffinic/Group II, Phillips 66); BioLife (bio-isoalkanes, Total Energies); or combinations thereof.

As described herein, compositions of the present disclosure may optionally include an additive. Optional additives may include, for example, a thermally conductive material, a phase transition additive, an antioxidant, a surfactant, or combinations thereof, among other optional additives.

The optional thermally conductive material may be used to improve thermal conductivity of the composition without increasing viscosity. Thermally conductive materials may include a carbon-based material, a metal-containing material, or combinations thereof.

Carbon-based materials as thermally conductive materials may include carbon nanotubes (CNTs), graphene particles, graphene oxide (GO) particles, silicon carbide (SIC) particles or combinations thereof. CNTs may be functionalized, for example, surface functionalized, with carboxylic acid (—COOH) groups or amine (—$NH_2$) groups. Functional groups on the CNTs may help to improve dispersion stability of the CNTs in the base fluid. Graphene particles and/or graphene oxide particles may have a lateral dimension in a range from about 100 nanometers (nm) to about 10 microns (μm), such as from about 200 nm to about 5 μm such as from about 300 nm to 3 μm such as from about 500 nm to about 2 μm.

Any suitable metal-containing material may be used as a thermally conductive material. Metal-containing materials may include aluminum nitride (AlN) particles, copper (Cu) particles, silver (Ag) particles, boron nitride (BN) particles (such as hexagonal boron nitride (h-Bn), alumina ($Al_2O_3$) particles, magnesium oxide (MgO) particles, zinc oxide (ZnO) particles, or combinations thereof. The metal-containing materials may have any suitable shape such as platelet or platelet-like.

Compositions described herein may include any suitable amount of the thermally conductive material. For example, an amount of the thermally conductive material in a composition may be in a range from about 0.001 wt % to about 20 wt %, such as from about 0.1 wt % to about 15 wt %, such as from about 1 wt % to about 10 wt %, such as from about 2 wt % to about 3 wt %, or from about 0.001 wt % to about 5 wt %, such as from about 0.1 wt % to about 3 wt % based on a total wt % of the base fluid and the thermally conductive material, the total wt % of the base fluid and the one or more thermally conductive materials is 100 wt %. In these and other aspects, an amount of the base fluid in the composition may be in a range from about from about 85 wt % to about 99.9 wt %, such as from about 90 wt % to about 99 wt %, such as from about 95 wt % to about 98 wt %, or from about 95 wt % to about 99.999 wt %, such as from about 97 wt % to about 99.9 wt % based on the total wt % of the base fluid and the thermally conductive material.

Compositions described herein that include a thermally conductive material may have a thermal conductivity that is about 1% or more, about 3% or more, about 5% or more, about 10% or more, about 15% or more, about 20% or more, etc., and up to about 40% or less, about 35% or less, about 30% or less, about 25% or less, about 20% or less, about 15% or less, etc. than a thermal conductivity of the composition without the thermally conductive material. For example, a composition that includes a thermally conductive material may have a thermal conductivity that is from about 10% more to about 20% more, such as about 15% more, than a thermal conductivity of the composition without the thermally conductive material.

The optional thermally conductive material may be uniformly dispersed, or substantially uniformly dispersed, in compositions described herein using, for example, ultrasonic cavitation to achieve a stable emulsion.

Compositions described herein may further include an optional phase transition additive. The phase transition additive may be used to enhance a heat absorption capacity of the composition by increasing the effective specific heat of the composition. The phase transition additive may include encapsulated wax, a metallic phase change material, an organic phase change material, or combinations thereof.

Encapsulated wax as a phase transition additive may include microencapsulated wax and/or nanoencapsulated wax. Encapsulated wax refers to particles of paraffin wax that are coated with a protective shell to form micron-sized or nano-sized capsules. The protective shell of the encapsulated wax may be a polymer, an inorganic material, or a combination thereof. The encapsulated wax absorbs heat as it melts inside the protective shell and releases heat when the wax resolidifies (latent heat). The microencapsulated wax, such as a microencapsulated paraffin wax, may have a particle size in a range from about 1 μm to about 50 μm, such as from about 1 μm to about 30 μm. The nanoencapsulated wax, such as a nanoencapsulated paraffin wax, may have a particle size of about 1 μm or less, such as 500 nm or less, and greater than 1 nm. The encapsulated wax may have a melting point in a range from about 30° C. to about 70° C. Illustrative, but non-limiting, examples of encapsulated wax may include: MPCM 37D commercially available from MICROTEK®; MPCM 55D commercially available from MICROTEK®; MICRONAL® PCM commercially available from BASF; and BioPCM® Q Series commercially available from Phase Change Solutions.

Metallic phase change materials, as a phase transition additive, are substances that undergo a phase transition at a specific temperature, absorbing heat as it melts and releasing heat as it resolidifies during the process. Metallic phase change materials, in contrast to paraffin based phase change materials, may have higher thermal conductivity. The metallic phase change material may have a melting point in a range from about 30° C. to about 70° C. The metallic phase change material may have a particle size in a range from about 1 μm to about 50 μm, such as from about 1 μm to about 30 μm. Alternatively, the metallic phase change material may have a particle size of about 1 μm or less, such as 500 nm or less, and greater than 1 nm. Metallic phase change materials may include gallium, gallium-based alloys, or a combination thereof.

Organic phase change materials, as a phase transition additive, are substances that store and release thermal energy during a phase transition (for example, melting). The organic phase change material may include an alkane, an ester, or a combination thereof. The organic phase change material may have a particle size in a range from about 1 μm to about 50 μm, such as from about 1 μm to about 30 μm. Alternatively, the organic phase change material may have a particle size of about 1 μm or less, such as 500 nm or less, and greater than 1 nm. Alkanes useful as organic phase change materials may include any suitable solid natural or synthetic low melting alkane with a melting point in a range from about 25° C. to about 70° C., such as from about 30° C. to about 70° C., such as from about 35° C. to about 55° C. Such alkanes may include saturated C14-C30 hydrocarbons such as linear and saturated C14-C30 hydrocarbons. Non-limiting examples of alkane hydrocarbons suitable as organic phase change materials may include hexadecane, octadecane, icosane, and tetracosane. Esters useful as organic phase change materials may include any suitable solid natural or synthetic low melting ester with a melting point in a range from about 25° C. to about 70° C., such as from about 30° C. to about 70° C., such as from about 35° C. to about 55° C. Non-limiting examples of esters suitable as organic phase change materials may include coconut oil, dimethyl sebacate, or a combination thereof.

The wax of the encapsulated wax may be encapsulated in any suitable shell, such as a silica shell or polymer shell. The metallic phase change material, the organic phase change material, or both may be, independently, encapsulated in any suitable shell, such as a silica shell or polymer shell. Encapsulation of the wax, metallic phase change material, and/or organic phase change material may help enhance the stability of the wax or other phase change material and/or prevent, or at least mitigate, leakage into the base fluid of the composition. The encapsulated phase change material may have a particle size in a range from about 1 μm to about 50 μm, such as from about 1 μm to about 30 μm. Alternatively, the encapsulated phase change material may have a particle size of about 1 μm or less, such as 500 nm or less, and greater than 1 nm. Particles with sizes larger than this may settle out of the base fluid.

Compositions described herein may include any suitable amount of the phase transition additive. For example, an amount of the phase transition additive in a composition described herein may be in a range from about 0.001 wt % to about 20 wt %, such as from about 0.1 wt % to about 15 wt %, such as from about 1 wt % to about 10 wt %, such as from about 2 wt % to about 3 wt %, or from about 0.001 wt % to about 5 wt %, such as from about 0.1 wt % to about 3 wt % based on a total wt % of the base fluid and the phase transition additive, the total wt % of the base fluid and the one or more phase transition additives is 100 wt %. In these and other aspects, an amount of the base fluid in the composition may be in a range from about from about 85 wt % to about 99.9 wt %, such as from about 90 wt % to about 99 wt %, such as from about 95 wt % to about 98 wt %, or from about 95 wt % to about 99.999 wt %, such as from about 97 wt % to about 99.9 wt % based on the total wt % of the base fluid and the phase transition additive.

Compositions described herein that include a phase transition additive may have a specific heat capacity that is about 1% or more, about 3% or more, about 5% or more, about 10% more, about 15% or more, or about 20% or more, etc., and up to about 50% or less, about 40% or less, about 35% or less, about 30% or less, about 25% or less, about 20% or less, or about 15% or less, etc. than a specific heat capacity of the composition without the phase transition additive. For example, a composition that includes a phase transition additive may have a specific heat capacity that is from about 5% more to about 15% more, such as about 10% more, than a specific heat capacity of the composition without the one or more phase transition additives.

The optional phase change material may be uniformly dispersed, or substantially uniformly dispersed, in compositions described herein using, for example, ultrasonic cavitation to achieve a stable emulsion.

Compositions described herein that include a base fluid, a thermally conductive material, and a phase transition additive may include any suitable amount of the thermally conductive materials and phase transition additives. For example, a weight ratio of the thermally conductive material to the phase transition additive may be selected to maintain the KV40 of the composition at about 150 cSt or less. Additionally, or alternatively, a weight ratio of the thermally conductive material to the phase transition additive may be in a range from about 0.01:1 to about 1:1, such as from about 0.02:1 to about 0.5:1, such as from about 0.05:1 to about 0.2:1 (thermally conductive material:phase transition additive).

Compositions described herein may further include an optional antioxidant. The antioxidant may be used to help prevent, or at least mitigate, degradation of the composition over time, help ensure long-term performance, or both. The antioxidant may help inhibit oxidation that leads to formation of byproducts that can reduce dielectric strength and/or compromise the safety and inefficiency of the composition. The optional antioxidant may be uniformly dispersed, or substantially uniformly dispersed, in compositions described herein.

Any suitable antioxidant may be utilized such as a hindered phenol, an aromatic amine, or combinations thereof. Illustrative, but non-limiting, examples of hindered phenol antioxidants may include butylated hydroxytolulene (BHT), butylated hydroxanisol (BHA), pentaerythritol tetrakis(3-(3,5-di-tert-butyl-4-hydroxyphenyl) propionate) (IRGANOX® 1010), octadecyl 3-(3,5-di-tert-butyl-4-hydroxyphenyl) propionate (IRGANOX® 1076), or combinations thereof. Illustrative, but non-limiting, examples of aromatic amine antioxidants may include alkylated diphenyl amine, N-Phenyl-1-naphthylamine, or a combination thereof.

Compositions described herein may further include an optional surfactant. The surfactant may be utilized to help prevent, or at least mitigate, agglomeration of an additive described herein (for example, thermally conductive material, phase transition additive, etc.) in the composition and/or help maintain stability of the additive in the composition.

Any suitable surfactant may be utilized such as a nonionic surfactant, an anionic surfactant, a cationic surfactant, an amphoteric surfactant, or combinations thereof. Non-limiting examples of nonionic surfactants useful in compositions described herein may include sorbitan monooleate (Span 80), a polyethylene glycol (PEG) derivative, a polyoxyethylene castor oil derivative, or combinations thereof. Non-limiting examples of anionic surfactants useful in compositions described herein may include sodium dodecyl sulfate (SDS), sodium dodecylbenzene sulfonate, sodium stearate, or combinations thereof. A non-limiting example of a cationic surfactant useful in compositions described herein may include cetyltrimethylammonium bromide (CTAB). Non-limiting examples of amphoteric surfactants useful in compositions described herein may include cocamidopropyl betaine, octadecyl dihydroxyethyl amine oxide, or combinations thereof.

The optional surfactant may be uniformly dispersed, or substantially uniformly dispersed, in compositions described herein.

Compositions of the present disclosure may be characterized as having any suitable thermal conductivity. For example, a composition described herein may have a thermal conductivity of about 0.12 watts per meter kelvin (W/m·K) or more, such as in a range from about 0.12 W/m·K to about 0.20 W/m·K, such as from about 0.14 W/m·K to about 0.18 W/m·K, such as from about 0.15 W/m·K to about 0.16 W/m·K. Measurement of thermal conductivity is described in the Examples Section.

Compositions of the present disclosure may be characterized as having any suitable specific heat capacity. For example, a composition described herein may have a specific heat capacity of about 1.8 joules per gram kelvin (J/g·K) or more, such as in a range from about 1.8 J/g·K to about 2.4 J/g·K, such as from about 2.0 J/g·K to about 2.3 J/g·K, such as from about 2.1 J/g·K to about 2.3 J/g·K, such as from about 2.2 J/g·K to about 2.25 J/g·K, or in a range from about 1.9 J/g·K to about 2.3 J/g·K, such as from about 2 J/g·K to about 2.2 J/g·K. Measurement of specific heat capacity is described in the Examples Section.

Compositions of the present disclosure may be characterized as having any suitable electrical resistivity. For example, a composition described herein may have an electrical resistivity of about $1\times10^9$ ohm centimeters (22 cm) or more, such as in a range from about $1\times10^9$ Ω·cm to about $9.9\times10^{14}$ Ω·cm, such as from about $1\times10^{11}$ Ω·cm to about $9.9\times10^{14}$ Ω·cm, such as from about $1\times10^{11}$ Ω·cm to about $9.9\times10^{13}$ Ω·cm. Measurement of electrical resistivity is described in the Examples Section.

Compositions of the present disclosure may be characterized as having any suitable dielectric constant. For example, a composition described herein may have a dielectric constant of about 3.5 or less, such as about 3.2 or less, such as about 3.0 or less, such as about 2.5 or less, such as about 2.3 or less (with a minimum of about 1.0), such as in a range from about 1.9 to about 2.5, such as from about 2.0 to about 2.4, such as from about 2.1 to about 2.3, such as about 2.2, or in a range from about 1.9 to about 2.2, such as from about 2.0 to about 2.1. Measurement of dielectric constant is described in the Examples Section.

Compositions of the present disclosure may be characterized as having any suitable dielectric loss factor. For example, a composition described herein may have a dielectric loss factor of about 0.001 or less, greater than 0, or a combination thereof, such as in a range from about 0 to about 0.001, such as from about 0.0001 to about 0.001, such as from about 0.0002 to about 0.0009, such as from about 0.0003 to about 0.0008, such as from about 0.0004 to about 0.0007. Such dielectric loss factor may help ensure minimal energy dissipation in electrical applications. Measurement of dielectric loss factor is described in the Examples Section.

Compositions of the present disclosure may be characterized as having any suitable dielectric strength. For example, a composition described herein may have a dielectric strength of about 5 kilovolts per millimeter (kV/mm) or more, such as about 10 kV/mm or more, such as about 20 kV/mm or more, or about 30 kV/mm or more, about 40 kV or more, such as about 50 kV or more, etc., and up to about 100 kV/mm or less, such as about 80 kV/mm or less, such as about 70 kV/mm or less, such as about 60 kV/mm or less, such as about 50 kV/mm or less, etc. Measurement of dielectric strength is described in the Examples Section.

Compositions of the present disclosure may be characterized as having any suitable KV40. For example, a composition described herein may have a KV40 that is about 150 cSt or less, such as in a range from about 1 cSt to about 150 cSt, such as from about 10 cSt to 125 cSt, such as from about 20 cSt to 100 cSt, such as from about 30 cSt to 75 cSt, or from about 1 cSt to about 50 cSt, such as from about 1 cSt to about 30 cSt, such as from about 5 cSt to about 25 cSt, such as from about 10 cSt to about 20 cSt, or from about 1 cSt to about 20 cSt, such as from about 2 cSt to about 20 cSt, such as from about 3 cSt to about 10 cSt. Measurement of KV40 is described in the Examples Section.

Compositions of the present disclosure may be characterized as having any suitable KV100. For example, a composition described herein may have a KV100 of about 20 cSt or less, such as in a range from about 1 cSt to about 20 cSt, such as from about 1 cSt to about 15 cSt, such as from about 1 cSt to about 10 cSt, such as from about 1.5 cSt to about 5 cSt, such as from about 1.7 cSt to about 4 cSt, such as from about 2 cSt to about 3.5 cSt. Measurement of KV100 is described in the Examples Section.

Compositions of the present disclosure may be characterized as having any suitable electrical conductivity. For example, a composition described herein may have an electrical conductivity of less than 0.15 pS/m, such as less than 0.12 pS/m, such as less than 0.10 pS/m. Measurement of electrical conductivity is described in the Examples Section.

Compositions of the present disclosure may be characterized as having any suitable breakdown voltage. For example, a composition described herein may have a breakdown voltage of about 30 kilovolts (kV) or more, such as about 40 kV or more, such as in a range from about 45 kV to about 100 kV, such as in a range from about 45 kV to about 70 kV, such as from about 50 kV to about 65 kV, such as from about 55 kV to about 60 kV, or in a range from about 40 kV to about 60 kV, such as from about 45 kV to about 55 kV, such as from about 47 kV to about 51 kV. Such breakdown voltages may help ensure safe use of high-voltage power electronics. Measurement of breakdown voltage is described in the Examples Section.

Compositions of the present disclosure may have any suitable viscosity index. For example, a composition described herein may have a viscosity index in a range from about 60 to about 170, such as from about 70 to about 150, such as from about 60 to about 110, such as from about 70 to about 100, such as from about 75 to about 95. Measurement of viscosity index is described in the Examples Section.

Compositions of the present disclosure may have any suitable flash point. For example, a composition described herein may have a flash point of about 115° C. or more, such as about 125° C. or more, such as about 150° C. or more, such as about 170° C. or more, in a range from about 115° C. to about 250° C., such as from about 135° C. to about 225° C., such as from about 145° C. to about 200° C., or from about 150° C. to about 250° C., such as from about 170° C. to about 250° C. Measurement of flash point is described in the Examples Section.

Compositions of the present disclosure may have any suitable pour point. For example, a composition described herein may have a pour point of about −30° C. or less (more negative), such as about −40° C. or less, such as about −50° C. or less, such as about −60° C. or less, or in a range from about −70° C. to about −30° C., such as from about −60° C. to about −40° C., such as about −50° C. Measurement of pour point is described in the Examples Section.

Compositions of the present disclosure may have any suitable specific gravity. For example, a composition described herein may have a specific gravity of about 0.79 $g/cm^3$ or more, about 0.9 $g/cm^3$ or less, or a combination thereof, such as in a range from about 0.795 $g/cm^3$ to about 0.845 $g/cm^3$, such as from about 0.80 $g/cm^3$ to about 0.84 $g/cm^3$, such as from about 0.82 $g/cm^3$ to about 0.84 $g/cm^3$. Measurement of specific gravity is described in the Examples Section.

Compositions of the present disclosure may have any suitable oxidative stability. For example, a composition described herein may have an oxidative stability of about 500 hours or more, about 1,000 hours or more, about 2,000 hours or more, about 6,000 hours or more, about 10,000 hours, or about 8,000 hours or more, etc. and up to about 20,000 hours or less, about 15,000 hours or less, about 12,000 hours or less, about 10,000 hours or less, about 8,000 hours or less, about 6,000 hours or less, or about 5,000 hours or less. Additionally, or alternatively, a composition described herein may have an oxidative stability in a range from about 500 hours to 20,000 hours, such as from about 1,000 hours to about 15,000 hours, such as from about 2,000 hours to about 12,000 hours, such as from about 6,000 hours to about 10,000 hours, or about 8,000 hours. Measurement of oxidative stability is described in the Examples Section.

Compositions of the present disclosure may meet or exceed immersion cooling standards put forth according to the Open Compute Project (OCP).

As described herein, compositions of the present disclosure may include a blend of HR-PIB and another base fluid. As a lower-cost alternative compared to PAO and ester-based fluids, the use of HR-PIB enables the creation of blended formulations that maintain high-performance standards while offering significant economic advantages. This makes HR-PIB an attractive option for scaling immersion cooling technologies, particularly in cost-sensitive applications such as hyperscale data centers and EV power electronics cooling.

As also described herein, compositions may include HR-PIB and an additive to adjust, for example, the thermal conductivity, viscosity stability, and dielectric strength of the composition. Here, HR-PIB may be additized with additives such as a thermally conductive material, a phase transition additive, an antioxidant, a surfactant, or combinations thereof. Addition of such additives may be used to adapt the HR-PIB based compositions to varied immersion cooling environments, from high-performance computing to EV battery thermal management. By incorporating such additives, the HR-PIB-based immersion cooling compositions may be further adjusted to exceed existing industry benchmarks, making them a compelling alternative to conventional synthetic hydrocarbons while ensuring both technical superiority and cost-effectiveness.

Process for Producing Compositions

Aspects of the present disclosure also generally relate to processes for producing compositions of the present disclosure. In general, compositions of the present disclosure may be formed by any suitable technique such as by, for example, blending, mixing, high-shear mixing sonication, ultrasonication, cavitation, ultrasonic cavitation, or combinations thereof.

Compositions comprising one or more base fluids (for example, HR-PIB and another base fluid) may be formed by introducing or contacting a first base fluid (for example, HR-PIB) to a second base fluid (for example, PAO). After introduction or contact, the first and second base fluids may be mixed under high-shear conditions, or combinations thereof to form a blended fluid.

Compositions comprising a base fluid and an additive described herein, for example, a thermally conductive additive, a phase transition additive, an antioxidant, a surfactant, or combinations thereof may be formed by introducing or contacting one or more of the additives to the base fluid. After introduction or contact, the one or more additives and the base fluid may be blended, sonicated, ultrasonicated, mixed under high-shear conditions, or subjected to ultrasonic cavitation, or combinations thereof to form an additized fluid.

In some aspects, which may be combined with other aspects, a process for producing a composition of the present disclosure may include dispersing an additive described herein (for example, a thermally conductive material, a phase transition additive, an antioxidant, a surfactant, or combinations thereof) in a base fluid described herein (for example, HR-PIB) under conditions effective to form a mixture comprising the additive and the base fluid. Conditions effective to form the mixture may include high-shear mixing conditions. High-shear mixing conditions may include any suitable shear rate such as a shear rate of about 10,000 $s^{-1}$, such as in a range from about 10,000 $s^{-1}$ to about 100,000 $s^{-1}$, such as from about 20,000 $s^{-1}$ to about 80,000 $s^{-1}$, such as from about 40,000 $s^{-1}$ to about 60,000 $s^{-1}$. High-shear mixing conditions may further include mixing for a duration of about 5 minutes or more, such as in a range from about 5 minutes to about 60 minutes, such as from about 15 minutes to about 45 minutes. High-shear mixing conditions may further include mixing at a temperature of about 20° C. or more, such as in a range from about 20° C. to about 80° C., such as from about 25° C. to about 60° C., such as from about 30° C. to about 50° C. High-shear mixing may serve to homogenize the mixture. Additionally, or alternatively, high-shear mixing may serve to achieve a uniform dispersion or substantially uniform dispersion of the additive in the base fluid. Additionally, or alternatively, high-shear mixing may serve to reduce the particle size of the additives to be less than 5 μm such as less than 1 μm. For example, phase transition additives having a size of about 30 μm may be reduced in size to less than 5 μm by the high-sear mixing.

After forming the mixture, the process may further include filtering the mixture to produce a composition described herein. Filtering may be performed to achieve an appropriate particle size distribution (PSD) of the one or more additives present. For example, the filtering may be performed to achieve a PSD of the additive (for example, thermally conductive material and/or phase transition additive) in the composition that is about 5 μm or less, such as about 2 μm or less, such as about 1 μm or less, such as about 500 nm or less, such as about 200 nm or less. Lower particle sizes may help achieve a stable mixture or emulsion (or help achieve a mixture or emulsion characterized as having long-term stability) whereby the additive particles do not settle out of the base fluid.

Uses and Methods of Using

Aspects of the present disclosure also generally relate to methods of using compositions of the present disclosure. Such methods may include heat management methods interchangeably referred to herein as immersion cooling methods, heat transfer methods, heat management methods, thermal management methods, or methods of cooling electronic components.

Heat management methods described herein may include contacting an article with a composition described herein. The article may include a heat-generating article, or may include a component affixed to a heat-generating article. For example, the article may include a heat sink affixed to (attached to) a heat-generating article, may include the heat-generating article, or may include both a heat-generating article and a heat sink affixed to the heat-generating article. The article may include any suitable device, such as an electronic device, an electronic component, an electrical device, or an electrical component. The article may be a component present in a computing system, an artificial intelligence system, a cryptocurrency mining system, an edge computing system, a data center, electric vehicle, aircraft, combinations thereof, among others.

The electronic device may be a computer or part of a computer. Computers may refer to electronic devices that store, retrieve, and/or process data. Parts of a computer may include any one or any combination of more than one electronic component of a computer. Electronic components of a computer may include an electronic random access memory component; a memory storage component; a central process unit (CPU); a graphics processing unit (GPU); an electronic power distribution component, such as an electronic transformer; a circuit board; a server, such as a server that includes a circuit board with one or more electronic component mounted thereon; or combinations thereof.

In some aspects, which may be combined with other aspects, the article may include an electronic component present in an electronic device. For example, the electronic component may include a component present in a computing system, an artificial intelligence system, a cryptocurrency mining system, an edge computing system, a data center, electric vehicle, aircraft, or combinations thereof, among others. In some aspects, which may be combined with other aspects, the electronic device and/or electronic component may include a server, a rack of a server, a motherboard, a memory board, a microprocessor, a chip, a fabricated electronic device such as a semiconductor-fabricated electronic device, a component thereof, or combinations thereof.

The electrical device may be a battery, a part of a battery, an electric motor, a part of an electric motor, a part of an electric vehicle, a part of an aircraft, or combinations thereof. In some aspects, which may be combined with other aspects, the article may include an electrical component present in an electrical device, such as an electrical component present in a battery system, an electrical component in an electric motor, an electrical component in an electric vehicle, or combinations thereof, among others. In some aspects, which may be combined with other aspects, the electrical device and/or electrical component may include a battery, an inverter, a DC to DC inverter, a charger, a phase change inverter, an electric motor, an electric motor controller, a DC to AC inverter, a component thereof, or combinations thereof.

Introducing or contacting the composition described herein with the article may include immersing the electrical component (for example, a fabricated electronic component) in the composition described herein, submerging the article (for example, a server) in the composition described herein, circulating the composition described herein between and/or through electronic component(s) (for example, between racks of a server), or combinations thereof.

The composition described herein contacts the article and cools the electronic component by, for example, heat transfer. The composition described herein may be in direct fluid communication with the article or indirect fluid communication with the electronic component.

The article may be operated along with operating a heat transfer system. The heat transfer system may be operated, for example, by circulating the composition described herein through the heat transfer system. For example, the heat transfer system may include a pump to move the composition described herein (for example, a heat transfer composition) to desired locations, such as a bath, in which the article is disposed or housed in. The heat transfer system may further include a heat exchanger. The pump of the heat transfer system may pump the composition described herein between the heat exchanger and the location (for example, the bath) in which the electronic components are disposed or housed and a reservoir in which the heat exchanger is disposed or housed in.

For example, the heat transfer system may pump cooled composition (heat transfer composition) from the reservoir into the bath, and to pump heated composition (heat transfer composition) out of the bath through the heat exchanger and back into the reservoir. In this manner, while the article(s) are operated, the heat transfer system may also be operated to provide cooled heat transfer composition to the article(s) present in the bath to absorb heat generated by the article(s), and to remove heat transfer composition that has been heated by the article(s) to be sent to the heat exchanger for cooling and recirculation back into the reservoir.

Aspects of the present disclosure also generally relate to heat management systems for thermally managing an article present in the heat management system. The article can include those articles described above. The heat management system further includes a composition of the present disclosure, for example, a heat transfer composition or immersion cooling composition. The heat management system may further include a heat transfer system, such as the heat transfer system described above.

The following examples are put forth so as to provide those of ordinary skill in the art with a complete disclosure and description of how to make and use aspects of the present disclosure, and are not intended to limit the scope of aspects of the present disclosure. Efforts have been made to ensure accuracy with respect to numbers used but some experimental errors and deviations should be accounted for.

EXAMPLES

Examples of HR-PIB were synthesized and tested as heat transfer compositions/immersion cooling compositions. Physical and dielectric properties of the HR-PIB examples were measured according to the Test Methods and were compared to conventional immersion cooling fluids.

Test Methods

The following methods were utilized to determine characteristics of the compositions. Unless specified to the contrary or the context clearly indicates otherwise, these measurement methods are used for the various characteristics of the compositions within the detailed description and the claims.

Specific gravity (at 15.5° C.) was determined according to ASTM D4052.

Kinematic viscosity (at 40° C.) was determined according to ASTM D445. Kinematic viscosity (at 40° C.) is also referred to as KV40.

Kinematic viscosity (at 100° C.) was determined according to ASTM D445. Kinematic viscosity (at 100° C.) is also referred to as KV100.

Viscosity index (VI) was determined according to ASTM D2270 by measuring the fluid's viscosity at both 40° C. and 100° C.

Pour point was determined according to ASTM D5949.

Flash point was determined according to ASTM D92.

Thermal conductivity (at 40° C.) was determined according to ASTM D2717.

Specific heat capacity (at 40° C.) was determined according to ASTM D7896.

Dielectric loss factor (at 25° C.) was determined according to ASTM D924.

Breakdown voltage (at 25° C.) was determined according to ASTM D877.

Dielectric strength (at 25° C.) was determined according to ASTM D877.

Dielectric constant (at 25° C.) was determined according to ASTM D924.

Electrical conductivity (at 25° C.) was determined according to ASTM 1169.

Electrical resistivity (at 25° C.) was determined according to ASTM D1169.

Oxidative stability (at 150° C.) was determined by the rotating pressure vessel oxidation test (RPVOT) according to ASTM D2272.

HR-PIB. The type and amount of each olefin isomer (for example, alpha vinylidene, beta vinylidene, and other isomers) was determined by $^{13}C$ NMR. $^{13}C$ NMR spectra were collected using a 500 MHz Bruker pulsed Fourier transform NMR spectrometer equipped with a 10 mm Broad Band Observation (BBO) probe at about room temperature. The polymer sample was dissolved in chloroform-d ($CDCl_3$) and transferred into a 10 mm glass NMR tube. Typical acquisition parameters were inverse-gated (IG) decoupling, a 90° pulse, and a 40 second relaxation delay. Chemical shifts were determined relative to the $CDCl_3$ signal which is set to about 77.2 ppm. To achieve maximum signal-to-noise for quantitative analysis, multiple data files may be added together. The spectral width was adjusted to include all of the NMR resonances of interest. $^{13}C$ NMR chemical shifts ($CDCl_3$) for the olefin carbon atoms are provided below in Table 1. All data provided in Table A is approximate values. In Table A, the chemical shift provided corresponds to the carbon underlined.

TABLE A $^{13}C$ NMR Chemical Shifts of HR-PIB

| Type of Olefin Isomer | Chemical Shifts, ppm |
|---|---|
| alpha vinylidene isomer | 143 ($R\underline{C}(CH_3){=}CH_2$); and 115 ($RC(CH_3){=}\underline{C}H_2$) |
| beta vinylidene isomer | 136 ($R\underline{C}(H){=}C(CH_3)_2$); and 128 ($RC(H){=}\underline{C}(CH_3)_2$) |
| terminal trisubstituted vinylidene isomer (1) | 134 ($R\underline{C}(CH_3){=}CH(CH_3)$); and 123 ($RC(CH_3){=}\underline{C}H(CH_3)$) |
| terminal trisubstituted vinylidene isomer (2) | 139 ($R\underline{C}(H){=}C(CH_3)(CH_2CH_3)$); and 130 ($RC(H){=}\underline{C}(CH_3)(CH_2CH_3$) |
| terminal tetrasubstituted vinylidene isomer | 133 ($R\underline{C}(CH_3){=}C(CH_3)_2$); and 122 ($RC(CH_3){=}\underline{C}(CH_3)_2$) |
| internal disubstituted vinylidene isomer | 149 ($R\underline{C}({=}CH_2)(CH_3)$); and 111 ($RC({=}\underline{C}H_2)(CH_3)$) |

When the alpha vinylidene isomer content (wt %) was determined to be about 75 wt % or greater, the PIB comprises HR-PIB. When the alpha vinylidene isomer content (wt %) was determined to be less than 75 wt %, the PIB comprises a mid-range vinylidene PIB. Generally, HR-PIB may have the following content: alpha vinylidene content (≥75 wt % or more); beta vinylidene isomer (<10-15 wt %); terminal trisubstituted vinylidene isomer (1) (<1 wt %); terminal trisubstituted vinylidene isomer (2) (<2-5 wt %); terminal tetrasubstituted vinylidene isomer (<2-5 wt %); internal disubstituted vinylidene isomer (<2-5 wt %).

Molecular weight. Molecular weights (weight-average molecular weight, Mw, number-average molecular weight, Mn), and Mw/Mn (PDI) were determined using gel permeation chromatography (GPC). Equipment included a Waters Alliance 2695 HPLC system with a differential refractive index detector (DRI). A typical GPC procedure was to dissolve the sample to be tested in tetrahydrofuran (THF) at a concentration of about 1 wt % to about 10 wt %. The polymer solution was pumped through a series of columns packed with Styragel beads of known porosity. Typical pore diameters range from about 10,000 Å down to about 50-100 Å, and a typical column string includes a 10+Å column, a 103 Å column, a 1000 Å column and a 2-100 Å column. For example, Waters Styragel HR columns 1, 3, and 4 may be used. The nominal flow rate was about 1.0 ml/min. The various transfer lines, columns, and differential refractometer (the DRI detector) were contained in an oven maintained at about 40° C. Elution solvent was THF. There was a 105-sample carousel for automatic injections. Empower 2 was the software system for controlling the separation and analysis.

The columns were calibrated with known molecular weight standards, both narrow distribution standards and broad distribution standards (for example, polystyrene standards from a molecular weight of 500 to 400K). From the calibration, Mn and Mw were determined for a polymer sample.

Polymer solutions for GPC were prepared by placing the dry polymer in a glass container, adding the desired amount of THE, and then filtering the mixture through a 0.45-micron nylon or polytetrafluoroethylene (PTFE) filter. All quantities were measured gravimetrically. The concentration of polymer to THF was about 10 mg/ml to 20 mg/ml. Prior to running each sample, the DRI detector and the injector were purged. Flow rate in the apparatus was then increased to about 0.5 ml/minute, and the DRI was allowed to stabilize for about 8 hours to about 9 hours before injecting the first sample. Each sample run takes about one hour to complete.

Isobutylene conversion to PIB, percent yield, and selectivity. Isobutylene conversion to HR-PIB was determined by gas chromatography according to ASTM D424-09 on an Agilent 6890 Gas Chromatograph with dual flame ionization detector using a 30 meter Restek RTX column and Zero grade nitrogen carrier gas at a flow rate of about 30 cc/min with a split ratio of 10. Percent yield of HR-PIB was determined gravimetrically by dividing the weight of the HR-PIB product recovered by the weight of the isobutylene used in the polymerization and multiplying by 100. Selectivity was determined gravimetrically by dividing the weight of the HR-PIB product recovered by the sum of the oligomers and HR-PIB produced and multiplying by 100.

Example 1: Synthesis of HR-PIB

A lab-scale tube-in-shell loop reactor was configured with 55 tubes, each measuring 15 inches in length, with an outer diameter (OD) of 0.125 inches and an inner diameter (ID) of 0.110 inches, resulting in a total reactor volume of 128 mL. The reaction mixture was circulated through the tubes using an inline circulation pump operating at a flow rate of 3,276 mL/min, providing a linear velocity of 6 inches per second within the tubes. The combined volume of the reactor and circulation loop was 200 mL.

High-purity isobutylene was introduced at a flow rate of about 150 mL/min, yielding a residence time of about 80 seconds. The catalyst system included a boron trifluoride-methanol ($BF_3$-MeOH) complex, adsorbed on a silica-alumina substrate at a loading of 67 wt % of the $BF_3$-MeOH complex. The molar ratio of methanol to $BF_3$ was 1.4:1. The catalyst was dispersed in ACS-grade hexane (low water) at a concentration of 10 wt %, with a flow rate of 3.5 mL/min, achieving an active catalyst concentration of approximately 2,300 ppm (based on the total high-purity isobutylene feed flow). The catalyst flow rate was adjusted to target an isobutylene conversion of approximately 80 wt %. The reactor feed flows upward through the reactor, with the catalyst injected into the high-purity isobutylene feed line at the circulation pump inlet to ensure uniform dispersion before entering the reactor. To control the reaction temperature, a 50:50 wt % methanol-water solution was circulated through the shell side of the reactor from an external chiller, operating at a flow rate of 22 L/min. The chiller temperature was adjusted to maintain the reactor at the desired operating temperature, ensuring the production of HR-PIB with the targeted molecular weight.

Example 1A: Synthesis and Characterization of HR-PIB (Mn ~350 g/Mol)

The reactor was operated to maintain an inlet temperature of 81° C. and an outlet temperature of 83° C. The feed flow rate was maintained at 148 mL/min, while the catalyst flow rate was set to 3.2 mL/min, resulting in a residence time of 81 seconds and an active catalyst concentration of 2,160 ppm (wt %).

The crude reaction mixture was immediately quenched using a dilute aqueous KOH solution and maintained at 70° C. to facilitate the venting of unreacted high-purity isobutylene. After quenching, the aqueous and organic layers were separated, and the HR-PIB layer was thoroughly washed with multiple portions of distilled water to ensure the complete removal of catalyst residues. Quenching with KOH and washing with water is used on lab scale and is optional on industrial scales. At the commercial scale, the catalyst can be efficiently removed through filtration or centrifugation, eliminating the need for water washing and thereby preventing wastewater generation. The washed and withered HR-PIB crude product was subsequently stripped using a rotary evaporator at 225° C. under a vacuum of 25 mmHg to remove oligomers and low molecular weight polymers. The conversion and selectivity were determined gravimetrically, yielding 79 wt % conversion and 56.3 wt % selectivity. The Mn was analyzed using gel permeation chromatography (GPC), showing an Mn of about 350 g/mol with a ratio of Mw/Mn of about 1.4. The kinematic viscosities at 40° C. (KV40) and 100° C. (KV100) were measured to be about 20.0 cSt and about 4.0 cSt, and the viscosity index (VI) was determined to be about 93.

Example 1B: Synthesis and Characterization of HR-PIB (Mn ~320 g/Mol)

The procedure described in Example 1A was repeated, except that the reactor inlet temperature was 84° C., the reactor outlet temperature was 86° C., the high-purity isobutylene feed flow rate was 151 mL/min, and the catalyst flow rate was 3.2 mL/min. The resulting conversion was about 82 wt %, with a selectivity of about 53.6 wt %.

Molecular weight analysis by GPC showed an Mn of about 320 g/mol with a ratio of Mw/Mn of about 1.3. The KV40 was determined to be 15.0 cSt, the KV100 was determined to be about 3.29 cSt, and the VI was determined to be about 78. The alpha vinylidene content was determined to be about 81%.

Example 1C: Synthesis and Characterization of HR-PIB (Mn ~450 g/Mol)

The procedure described in Example 1A was repeated, except that the reactor inlet temperature was 78° C., the reactor outlet temperature was 80° C., the high-purity isobutylene feed flow rate was 155 mL/min, and the catalyst flow rate was 3.3 mL/min. The resulting conversion was about 80 wt %, with a selectivity of about 63.6 wt %.

Molecular weight analysis by GPC showed an Mn of about 450 g/mol with a ratio of Mw/Mn of about 1.4. The KV40 was determined to be about 106 cSt, the KV100 determined to be about 15.1 cSt, and the VI was determined to be about 149. The alpha vinylidene content was determined to be about 82%.

Example 1D: Isolation and Characterization of Isobutylene Oligomers Such as C20 HR-PIB The isobutylene oligomers and low molecular weight polymers recovered from the stripping operations in Examples 1A, 1B, and 1C were combined and subjected to an additional batch stripping process at 250° C. under a vacuum of 100 mmHg. The residual liquid was collected and shown to have a KV40 of about 5.01 cSt and a KV100 of about 1.71 cSt. The alpha vinylidene content was determined to be about 79%. Gas chromatography (GC) analysis confirmed that the primary component of the product was mostly isobutylene pentamer (also referred to herein as a C20 HR-PIB (an HR-PIB having 20 carbon atoms)). The gravimetric yield of the C20+ fraction was about 62 wt %.

Example 1E: Characterization and Utilization of Overhead Fractions

The overhead fraction obtained from the stripping process primarily included C8-C16 isobutylene oligomers— isobutylene dimer (also referred to herein as C8 HR-PIB), isobutylene trimer (also referred to herein as C12 HR-PIB), and isobutylene tetramer (also referred to herein as C16 HR-PIB). These fractions are described below:

(a) The C8 fraction is predominantly diisobutylene (DIB, also referred to herein as C8 HR-PIB), a valuable co-product with multiple industrial applications. DIB is widely used as a precursor for phenolic antioxidants and surfactants or can be hydrogenated to produce high-octane gasoline alkylate, enhancing fuel quality.

(b) The C12 and C16 fractions may optionally be hydrogenated to produce isoparaffinic solvents, which are functionally similar to ExxonMobil's Isopar™ products. Alternatively, these fractions can be recycled back into the HR-PIB reactor for further conversion, thereby increasing process efficiency.

(c) As another option, the entire C8-C16 fraction may be recycled directly into the HR-PIB process, maximizing feedstock utilization while minimizing by-product waste.

An advantage of the HR-PIB process includes the ability to produce HR-PIB in high yield while targeting specific molecular weight distributions. This capability enables the production of lower molecular weight HR-PIB tailored for applications requiring reduced viscosity, expanding its suitability beyond traditional HR-PIB use cases. Additionally, the process maximizes feedstock utilization, ensuring that all products, including isobutylene oligomers and lower molecular weight fractions, are either directly utilized or efficiently recycled. This approach minimizes waste and enables near 100% overall yield efficiency, making the HR-PIB process highly sustainable and cost-effective for the production of immersion cooling fluids and other advanced applications. Although HR-PIB exhibits high oxidative stability, its performance may be further enhanced through additization to improve resistance to oxidation.

Example 2: Base Fluids

A series of base fluids were evaluated for their ability to, for example, conduct and disperse thermal energy. The base fluids are summarized in Tables 1A and 1B. Also shown in Tables 1A and 1B are selected physical and dielectric properties of the base fluids. In Tables 1A and 1B, "VI" refers to viscosity index, and "OCP" refers to the proposed Open Compute Project specification standard ("Base Specification for Immersion Fluids", Revision 1.0, Version 1.0, Dec. 1, 2022). Currently, the OCP specification standards are proposed standards.

TABLE 1A

| Sample | Base fluid type | Specific heat capacity, J/g · K | Breakdown voltage, kV | Dielectric strength, kV/mm | Electrical resistivity, Ω · cm | Dielectric constant |
|---|---|---|---|---|---|---|
| OCP | — | — | — | >6 | $>1 \times 10^{11}$ | ≤2.3 |
| 1-1 | C20 HR-PIB | — | 47 | — | $>1 \times 10^{13}$ | — |
| 1-2 | C20-C28 HR-PIB | 2.00 | 50 | >20 | $>1 \times 10^{13}$ | 2.2 |
| 1-3 | C24-C28 HR-PIB | 2.00 | 51 | >20 | $>1 \times 10^{13}$ | 2.2 |
| 1-4 | Group II base oil | 2.24 | — | >10 | — | 2.09 |
| 1-5 | PAO | 2.08 | — | >14 | — | 2.06 |
| 1-6 | PAO 2.5 | 2.107 | — | — | — | 2.26 |
| 1-7 | PAO 2 | 2.028 | — | — | — | 2.28 |
| 1-8 | PAO 5 | 1.81 | — | — | — | 2.26 |
| 1-9 | Ester | — | 65 | — | — | — |
| 1-10 | Ester | — | 82 | — | — | — |
| 1-11 | Isoparaffin GTL | — | — | — | — | — |
| 1-12 | PAO 2 | — | — | >60 | — | — |
| 1-13 | Isoparaffin GTL | — | — | — | — | — |
| 1-14 | Modified polysiloxane | 2.256 | — | >40 | $>1 \times 10^{15}$ | 2.276 |
| 1-15 | Modified polysiloxane | 1.656 | — | >38 | $>1 \times 10^{13}$ | 2.50 |
| 1-16 | PAO 2 | 2.2121 | — | >60 | $>1 \times 10^{14}$ | 2.100 |
| 1-17 | PAO 4 | 2.2119 | — | >60 | $>1 \times 10^{14}$ | 2.200 |
| 1-18 | PAO 7 | 2.203 | — | >60 | $>1 \times 10^{14}$ | 2.104 |
| 1-19 | PAO 10 | 2.1912 | — | >60 | $>1 \times 10^{14}$ | 2.220 |
| 1-20 | C12 isoparaffin | 2.12 | — | — | — | — |
| 1-21 | PAO 2 | 2.11 | — | — | — | — |
| 1-22 | C10 isoparaffin | 2.11 | — | — | — | — |
| 1-23 | PAO 2E | — | — | — | — | — |

| Sample | Thermal conductivity, W/m · K | KV40, cSt | KV100, cSt | VI | Flash point, ° C., | Pour point, ° C., | Specific gravity @15.5° C., g/cm³ |
|---|---|---|---|---|---|---|---|
| OCP | — | 15-20 | — | — | >150 | <−30 | <2.00 |
| 1-1 | — | 5.0 | 1.7 | — | — | <−60 | 0.803 |
| 1-2 | 0.15 | 15.0 | 3.29 | 78 | >150 | <−60 | 0.835 |
| 1-3 | 0.16 | 20.0 | 4.00 | 93 | >150 | −50 | 0.839 |
| 1-4 | 0.126 | 7.5 | 2.2 | 95 | 166 | — | 0.835 |
| 1-5 | 0.135 | 5.1 | 1.7 | — | 169 | <−40 | 0.797 |
| 1-6 | 0.143 | 8.6 | 2.5 | 120 | 202 | −54 | 0.81 |
| 1-7 | 0.143 | 4.6 | 1.6 | — | 160 | −39 | 0.80 |
| 1-8 | 0.153 | 25.7 | 5.3 | 145 | 251 | −48 | 0.83 |
| 1-9 | — | 5.0 | 1.5 | — | >170 | <−30 | — |
| 1-10 | — | 10.8 | 3.0 | — | >200 | <−55 | — |

TABLE 1A-continued

| | | | | | | | |
|---|---|---|---|---|---|---|---|
| 1-11 | — | — | — | — | — | — | — |
| 1-12 | — | 5.0 | — | — | 160 | −45 | — |
| 1-13 | — | — | — | — | — | — | — |
| 1-14 | 0.18 | 26 | — | — | 240 | <−57 | 0.860 |
| 1-15 | 0.143 | 19 | — | — | 216 | <−57 | 0.918 |
| 1-16 | 0.1397 | 7.25 | 2.22 | 115 | 203 | −60 | 0.820 |
| 1-17 | 0.1459 | 16.1 | 3.7 | 117 | 228 | −60 | 0.820 |
| 1-18 | 0.1480 | 36.1 | 6.8 | 149 | 260 | −58 | 0.830 |
| 1-19 | 0.1584 | 67.1 | 9.53 | 122 | 280 | −54 | 0.840 |
| 1-20 | 0.121 | 1.9 | 0.9 | — | 100 | −39 | 0.78 |
| 1-21 | 0.143 | 4.6 | 1.6 | — | 160 | −39 | 0.80 |
| 1-22 | 0.116 | 1.3 | 0.6 | — | 73 | −48 | 0.75 |
| 1-23 | — | 8.5 | 2.4 | 100 | >150 | −60.0 | 0.807 |

TABLE 1B

| Sample | Base fluid type | Specific heat capacity, J/g · K | Breakdown voltage, kV | Dielectric strength, kV/mm | Electrical resistivity, Ω · cm | Dielectric constant |
|---|---|---|---|---|---|---|
| 1-24 | PAO 6 | — | — | — | — | — |
| 1-25 | PAO 4 | — | — | 43.6 | — | 2.1 |
| 1-26 | PAO 3.5 | — | — | 34 | — | 2.08 |
| 1-27 | PAO 2 | — | — | 43.1 | — | 2.08 |
| 1-28 | PAO | — | — | — | — | — |
| 1-29 | PAO 2 | 2.08 | — | — | — | — |
| 1-30 | Group II base oil | 1.92 | — | — | — | — |
| 1-31 | Various | — | — | — | — | — |
| 1-32 | Silicone | — | — | — | — | — |
| 1-33 | Group II base oil | 1.97 | — | >22 | — | 2.12 |
| 1-34 | Group II base oil | 2.00 | — | >22 | — | <2.2 |
| 1-35 | Group II base oil | 1.90 | — | >22 | — | 2.20 |
| 1-36 | Soybean oil | 2.3076 | >35 | — | — | — |
| 1-37 | Paraffin | — | — | — | — | — |
| 1-38 | Synthetic polyol ester | 1.89 | — | — | $>1 \times 10^{12}$ | 2.25 |
| 1-39 | Synthetic ester | 1.97 | 80 | — | — | — |
| 1-40 | GTL | 2.274 | 42 | — | — | — |
| 1-41 | PAO 2 | — | 58 | — | — | — |
| 1-42 | PAO 2 | 2.26 | >50 | — | $>1 \times 10^{12}$ | — |
| 1-43 | PAO 2 | 2.203 | — | — | — | 2.09 |
| 1-44 | PAO 4 | 2.143 | — | — | — | 2.10 |
| 1-45 | PAO 6 | 2.028 | — | — | — | 2.13 |
| 1-46 | Bio Isoalkanes | — | — | — | — | — |
| 1-47 | Valvoline | 1.93 | 35 | — | $>1 \times 10^{12}$ | — |

| Sample | Thermal conductivity, W/m · K | KV40, cSt | KV100, cSt | VI | Flash point, ° C. | Pour point, ° C. | Specific gravity @15.5° C., g/cm$^3$ |
|---|---|---|---|---|---|---|---|
| 1-24 | — | 31.0 | 5.8 | 132 | 246.0 | −57.0 | 0.827 |
| 1-25 | — | 19.0 | 4.1 | 117 | 220 | −66.0 | 0.820 |
| 1-26 | — | 14.3 | 3.5 | 125 | 224 | <−78 | 0.817 |
| 1-27 | — | 5.0 | 1.70 | — | 157 | −66 | 0.798 |
| 1-28 | — | — | — | — | — | — | — |
| 1-29 | 0.133 | 5.1 | 1.8 | 101 | — | −66 | 0.775 |
| 1-30 | 0.126 | 7.6 | 2.2 | 99 | — | −45 | 0.809 |
| 1-31 | — | — | — | — | — | — | — |
| 1-32 | — | — | — | — | — | — | — |
| 1-33 | 0.132 | 8.13 | 2.37 | 109 | 154 | — | 0.827 |
| 1-34 | 0.125 | 3.58 | 1.37 | — | 128 | — | 0.827 |
| 1-35 | 0.127 | 5.77 | 1.89 | — | 136 | — | 0.838 |
| 1-36 | 0.1644 | 31.0 | 6.0 | 142 | 325 | — | 0.921 |
| 1-37 | — | 36.4 | 3.0 | 87 | 196 | −34 | 0.856 |
| 1-38 | 0.144 | 16 | 3.6 | 107 | 247 | −69 | 1.018 |
| 1-39 | 0.144 | 7.7 | 2.4 | 141 | 203 | −81 | 0.910 |
| 1-40 | 0.142 | 9.8 | — | — | 200 | −36 | 0.806 |
| 1-41 | — | 5.0 | 1.70 | — | 160 | −66 | 0.799 |
| 1-42 | 0.140 | 5.1 | — | — | 156 | −50 | 0.796 |
| 1-43 | 0.141 | 5.03 | 1.71 | — | 155 | −73 | 0.791 |
| 1-44 | 0.150 | 16.78 | 3.84 | 122 | 219 | — | 0.820 |
| 1-45 | 0.155 | 30.89 | 5.86 | 136 | 240 | — | 0.829 |
| 1-46 | — | — | — | — | — | — | — |
| 1-47 | 0.134 | 8.01 | 2.4 | 124 | 153 | −36 | 0.824 |

Samples 1-1 to 1-3 are HR-PIB base fluids, representing inventive examples according to aspects of the present disclosure. Specifically: Sample 1-1 is a C20 HR-PIB; Sample 1-2 is a mixture of different HR-PIB (C20-C28 HR-PIB, Mn from about 280 g/mol to about 364 g/mol); and Sample 1-3 is a mixture of different HR-PIB (C24-C28, Mn from about 336 g/mol to about 392 g/mol).

The HR-PIB samples were compared to fluids (comparative examples: Samples 1~4 to 1-47) that meet the proposed OCP specifications. This ensured that HR-PIB fluids described herein were compared against industry formulations, demonstrating that HR-PIB delivers comparable or improved performance while offering a significant cost advantage.

Cooling Fluid DC-15 (Sample 1-4) and Cooling Fluid DC-20 (Sample 1-5) are commercially available from Castrol. Compuzol IM2020 (Sample 1-6), Compuzol IM2015 (Sample 1-7), and Compuzol IM2025 (Sample 1-8) are commercially available from Lubrizol. Dehylub 5005 (Sample 1-9) and Dehylub 5015 (Sample 1-10) are commercially available from Emery Oleochemicals. Thermasafe N (Sample 1-11), Thermasafe R (Sample 1-12), and Thermasafe S (Sample 1-13) are commercially available from DCX Liquid Cooling Systems. Dowsil ICL-1000 (Sample 1-14) and Dowsil ICL-1100 (Sample 1-15) are commercially available from Dow. ElectroCool EC-110 (Sample 1-16), ElectroCool EC-120 (Sample 1-17), EC-130 (Sample 1-18), and ElectroCool EC-140 (Sample 1-19) are commercially available from Engineered Fluids Inc. Evogen TM1100 (Sample 1-20), Evogen TM1150 (Sample 1-21), and Evogen TM1070 (Sample 1-22) are commercially available from Lubrizol. DC 1150 (Sample 1-23), DC 1210 (Sample 1-24), DC 3220 (Sample 1-25), DC 3235 S (Sample 1-26), DC 3152 (Sample 1-27), and DC 3250 (Sample 1-28) are commercially available from ExxonMobil. Renolin FECC5 SYNTH (Sample 1-29) and Renolin FECC7 (Sample 1-30) are commercially available from Fuchs. Electrosafe (Sample 1-31) is commercially available from Green Revolution Cooling. ED01 (Sample 1-32) is commercially available from Innochill. Innovate Garda (Sample 1-33), Innovate Peyto (Sample 1-34), and Innovate Yarro (Sample 1-35) are commercially available from PetroCanada. NatureCool 2000 (Sample 1-36) is commercially available from Cargill. P66 70 ISO Grade 10 Industrial Oil (Sample 1-37) is commercially available from Phillips 66. Perstorp Synmerse DC Sample 1-38) is commercially available from Petronas. Priolube EF 3221 (Sample 1-39) is commercially available from Cargill. S3 X (Sample 1-40) is commercially available from Shell. Alpha-2 (Sample 1-41) is commercially available from Soltex. SmartCoolant (Sample 1-42) is commercially available from Submer. SynFluid 2 (Sample 1-43), SynFluid 4 (Sample 1-44), SynFluid 6 and (Sample 1-45) are commercially available from Chevron Phillips Chemical. BioLife (Sample 1-46) is commercially available from Total Energies. Valvoline (Sample 1-47) is commercially available from Aramco.

Overall, the data shown in Tables 1A and 1B indicate that aspects described herein may be utilized for heat transfer compositions and heat transfer applications/uses, such as immersion cooling compositions and immersion cooling applications/uses. For example, the physical and dielectric property data presented in Tables 1A and 1B confirm HR-PIB base fluids of the present disclosure (Samples 1-1 to 1-3) meet or exceed the proposed standards set forth by the Open Compute Project proposed specifications for immersion cooling fluids. For example, Samples 1-1 to 1-3 may be characterized as having a beneficial balance of KV40, flash point, and pour point relative to other base fluids.

Another series of base fluids were evaluated for their ability to, for example, conduct and disperse thermal energy. The base fluids are summarized in Table 2. Also shown in Table 2 are selected physical and dielectric properties of the base fluids. In Table 2, VI refers to viscosity index and OCP refers to the proposed OCP specification standard described herein.

Samples 2-1 to 2-4 represent inventive examples according to aspects of the present disclosure, and Samples 2-5 to 2-8 represent comparative examples. Sample 2-1 is a mixture of different HR-PIB (C20-C28 HR-PIB), Sample 2-2 is a mixture of different HR-PIB (C24-C28 HR-PIB), Sample 2-3 is a mixture of different HR-PIB (C28-C36 HR-PIB), and Sample 2-4 is a C20 HR-PIB. Sample 2-5 (comparative) and Sample 2-6 (comparative) are commercially available PAOs. Sample 2-7 (comparative) and Sample 2-8 (comparative) are commercially available isoparaffins.

TABLE 2

| Sample | Base fluid type | Mn, g/mol | Specific heat capacity, J/g · K | Dielectric strength, kV/mm | Electrical resistivity, Ω · cm | Dielectric constant |
|---|---|---|---|---|---|---|
| OCP | — | — | — | >6 | >1 × $10^{11}$ | ≤2.3 |
| 2-1 | C20-C28 HR-PIB | 320 | 2.22 | >50 | >1 × $10^{13}$ | 2.1 |
| 2-2 | C24-C28 HR-PIB | 350 | 2.22 | >50 | >1 × $10^{13}$ | 2.10 |
| 2-3 | C28-C36 HR-PIB | 450 | 2.22 | >50 | >1 × $10^{13}$ | 1.97 |
| 2-4 | C20 HR-PIB | 280 | 2.22 | >50 | >1 × $10^{13}$ | 2.00 |
| 2-5 | PAO 2 | 320 | 2.21 | >60 | >1 × $10^{14}$ | 2.10 |
| 2-6 | PAO 4 | 450 | 2.21 | >60 | >1 × $10^{14}$ | 2.20 |
| 2-7 | Isoparaffin | 140 | 2.11 | >50 | >1 × $10^{13}$ | 2.21 |
| 2-8 | Isoparaffin | 168 | 2.12 | >50 | >1 × $10^{13}$ | 2.21 |

| Sample | Electrical conductivity, pS/m | Thermal conductivity, W/m · K | KV40, cSt | KV100, cSt | VI | Flash point, ° C. | Pour point, ° C. | Specific gravity @15.5° C., g/cm$^3$ |
|---|---|---|---|---|---|---|---|---|
| OCP | — | — | 15-20 | — | — | >150 | <−30 | <2.00 |
| 2-1 | <0.10 | 0.14 | 15.0 | 3.29 | 78 | >150 | <−60 | 0.835 |
| 2-2 | <0.10 | 0.13 | 20.0 | 4.00 | 93 | >150 | −50 | 0.839 |
| 2-3 | <0.10 | 0.13 | 62.0 | 15.10 | 149 | >150 | −39 | 0.855 |
| 2-4 | <0.10 | 0.14 | 5.0 | 1.7 | — | >150 | <−60 | 0.803 |

TABLE 2-continued

| | | | | | | | | |
|---|---|---|---|---|---|---|---|---|
| 2-5 | <0.10 | 0.1397 | 7.25 | 2.22 | 115 | 203 | −60 | 0.820 |
| 2-6 | <0.10 | 0.1459 | 16.1 | 3.7 | 117 | 228 | −60 | 0.820 |
| 2-7 | <0.10 | 0.116 | 1.3 | 0.6 | — | 73 | −48 | 0.75 |
| 2-8 | <0.10 | 0.121 | 1.9 | 0.9 | — | 100 | −39 | 0.78 |

Physical and dielectric properties of HR-PIB are summarized in Table 2. These properties were evaluated for their suitability as immersion fluids in data centers and electric vehicle (EV) cooling applications and compared to the minimum immersion fluid specifications proposed by the Open Compute Project (OCP). The results demonstrate that HR-PIB meets or exceeds all OCP-defined requirements, confirming its viability as a novel next-generation immersion cooling fluid. For example, HR-PIB (Samples 2-1 to 2-4) meets or exceeds the proposed standards set forth by the OPC. For example, Samples 2-1 to 2-4 may be characterized as having a beneficial balance of KV40, flash point, and pour point relative to other base fluids. An advantage of HR-PIB produced as described herein lies in its exceptional quality and the lowest production cost in the industry for synthetic hydrocarbon fluids. Compared to polyalphaolefins (PAO), the current industry benchmark, HR-PIB delivers comparable or superior dielectric performance, making it a compelling alternative for next-generation thermal management applications.

Overall, the data indicates that aspects described herein may be utilized for heat transfer compositions and heat transfer applications/uses, such as immersion cooling compositions and immersion cooling applications/uses. These attributes position HR-PIB as a next-generation immersion cooling solution, combining cost-effectiveness, superior dielectric properties, and environmental sustainability for high-performance computing and electric vehicle (EV) applications.

Examples 3-5: Blended Base Fluids as Heat Transfer Compositions

As described herein, HR-PIB base fluids may be blended with other base fluids to tune overall performance. Hydrocarbons generally provide favorable dielectric and thermal characteristics for heat transfer and immersion cooling applications. Depending on the application, a manufacturer may want to balance certain properties of the heat transfer/immersion cooling fluid, such as KV40 and flash point. For example, single-phase immersion coolants may be chosen that have a KV40 in a range from about 2 cSt to about 20 cSt and a flash point ≥150° C. In general, however, lower viscosity often correlates with lower flash point, and vice versa. Therefore, use of a second base fluid can be used to adjust KV40 and/or flash point of the heat transfer composition.

Example 3: Blends of HR-PIB with a Bio-Derived Ester or a Synthetic Ester as Heat Transfer Compositions C20 HR-PIB offers a good balance of KV40 and flash point, and it can be blended with a bio-derived ester (such as a triglyceride) or a synthetic ester to further raise the flash point while keeping KV40≤10 cSt. In addition, ester content improves biodegradability. HYVOLT® NE was tested as an example bio-derived ester, and HYVOLT® SE was tested as an example synthetic ester. HYVOLT® NE includes greater than 99% vegetable oil (triglyceride). HYVOLT® SE includes greater than 99.5% fatty acid tetra esters (polyol ester).

HR-PIB/bio-derived ester samples and blends tested included: 0 vol % (Sample 3-1), 40 vol % (Sample 3-2), or 100 vol % (Sample 3-3) of HYVOLT® NE with the remainder C20 HR-PIB. Selected properties of the C20 HR-PIB/HYVOLT NE blend and the individual components of the blend are summarized in Table 3A.

TABLE 3A

| Sample | Hyvolt NE, vol % | C20 HR-PIB, vol % | KV40, cSt | Specific heat capacity, J/g · K | Thermal conductivity, W/m · K | Dielectric constant | Dielectric loss factor |
|---|---|---|---|---|---|---|---|
| 3-1 | 0 | 100 | 5.11 | 2.12 | 0.15 | 2.1 | 0.0004 |
| 3-2 | 40 | 60 | 9.26 | 2.09 | 0.152 | 2.6 | 0.0006 |
| 3-3 | 100 | 0 | 32.0 | 2.05 | 0.155 | 3.3 | 0.0010 |

| Sample | Hyvolt NE, vol % | C20 HR-PIB, vol % | Electrical resistivity, Ω · cm | Breakdown voltage, kV | Pour point, ° C. | Flash point, ° C. |
|---|---|---|---|---|---|---|
| 3-1 | 0 | 100 | $1.00 \times 10^{13}$ | 50 | −70 | 150 |
| 3-2 | 40 | 60 | $5.17 \times 10^{12}$ | 50 | −50 | 220 |
| 3-3 | 100 | 0 | $3.00 \times 10^{12}$ | 50 | −20 | 325 |

HR-PIB/synthetic ester blends tested included: 0 vol % (Sample 3-4), 40 vol % (Sample 3-5), or 100 vol % (Sample 3-6) of HYVOLT® SE with the remainder C20 HR-PIB. Selected properties of the C20 HR-PIB/HYVOLT SE blend and the individual components of the blend are summarized in Table 3B.

TABLE 3B

| Sample | Hyvolt SE, vol % | C20 HR-PIB, vol % | KV40, cSt | Specific heat capacity, J/g · K | Thermal conductivity, W/m · K | Dielectric constant | Dielectric loss factor |
|---|---|---|---|---|---|---|---|
| 3-4 | 0 | 100 | 5.00 | 2.12 | 0.150 | 2.1 | 0.0004 |
| 3-5 | 40 | 60 | 8.99 | 2.07 | 0.152 | 2.5 | 0.0003 |
| 3-6 | 100 | 0 | 28.8 | 2.00 | 0.155 | 3.2 | 0.0002 |

TABLE 3A continued

| Sample | Hyvolt SE, vol % | C20 HR-PIB, vol % | Electrical resistivity, Ω · cm | Breakdown voltage, kV | Pour point, ° C. | Flash point, |
|---|---|---|---|---|---|---|
| 3-4 | 0 | 100 | $1.00 \times 10^{13}$ | 50 | −70 | 150 |
| 3-5 | 40 | 60 | $7.14 \times 10^{12}$ | 59 | −64 | 193 |
| 3-6 | 100 | 0 | $5.00 \times 10^{12}$ | 72 | −56 | 258 |

Overall, the data shown in Tables 3A and 3B indicate that aspects of the present disclosure that include blends of HR-PIB with another base fluid may be utilized for heat transfer compositions and heat transfer applications/uses, such as immersion cooling compositions and immersion cooling applications/uses. For example, Sample 3-2 of Table 3A indicates that a blend of 40 vol % bio-derived ester and 60 vol % C20 HR-PIB provided a KV40 of less than 10 cSt and an increase in flash point of 150° C. or more (specifically, KV40=9.26 cSt and flash point=220° C.). Sample 3-5 of Table 3B indicates that a blend of 40 vol % synthetic polyol ester and 60 vol % C20 HR-PIB provided a KV40 of less than 10 cSt and a flash point of 150° C. or more (specifically, KV40=8.99 cSt and flash point=193° C.). The data indicates that blends of the present disclosure can have a beneficial balance of KV40 and flash point.

Example 4: Blends of HR-PIB with a Low Viscosity Monoester as Heat Transfer Compositions In this example, two different HR-PIB samples were blended with a low-viscosity monoester (DEHYLUB® 4003). DEHYLUB® 4003 includes 2-ethylhexyl laurate. Here, the inventors found compositions that include a higher-viscosity HR-PIB blended with a low-viscosity monoester, where the composition has a KV40 of about 10 cSt and a flash point ≥170° C., and exhibiting low dielectric loss and high electrical resistivity relative to the monoester alone, and where the HR-PIB fraction provides an enhancement of electrical insulation without materially degrading thermal conductivity or heat capacity.

HR-PIB/low viscosity monoester samples and blends tested included: 0 vol % (Sample 4-1), 40 vol % (Sample 4-2), or 100 vol % (Sample 4-3) of DEHYLUB® 4003 with the remainder HR-PIB (Mn of about 350 g/mol). Selected properties of the blend and the individual components of the blend are summarized in Table 4A.

TABLE 4A

| Sample | Dehylub 4003, vol % | HR-PIB (Mn ~350 g/mol), vol % | KV40, cSt | Specific heat capacity, J/g · K | Thermal conductivity, W/m · K | Dielectric constant | Dielectric loss factor |
|---|---|---|---|---|---|---|---|
| 4-1 | 0 | 100 | 50.0 | 2.15 | 0.152 | 2.2 | 0.0005 |
| 4-2 | 40 | 60 | 10.6 | 2.09 | 0.151 | 2.6 | 0.0011 |
| 4-3 | 100 | 0 | 5.0 | 2.00 | 0.150 | 3.3 | 0.0020 |

| Sample | Dehylub 4003, vol % | HR-PIB (Mn ~350 g/mol), vol % | Electrical resistivity, Ω · cm | Breakdown voltage, kV | Pour point, ° C. | Flash point, ° C. |
|---|---|---|---|---|---|---|
| 4-1 | 0 | 100 | $1.00 \times 10^{13}$ | 52 | −60 | 165 |
| 4-2 | 40 | 60 | $2.46 \times 10^{11}$ | 49 | −60 | 175 |
| 4-3 | 100 | 0 | $1.00 \times 10^{11}$ | 45 | −60 | 183 |

HR-PIB/low viscosity monoester samples and blends tested included: 0 vol % (Sample 4-4), 60 vol % (Sample 4-5), or 100 vol % (Sample 4-6) of DEHYLUB® 4003 with the remainder HR-PIB (Mn of about 450 g/mol). Selected properties of the blend and the individual components of the blend are summarized in Table 4B.

TABLE 4B

| Sample | Dehylub 4003, vol % | HR-PIB (Mn ~450 g/mol), vol % | KV40, cSt | Specific heat capacity, J/g · K | Thermal conductivity, W/m · K | Dielectric constant | Dielectric loss factor |
|---|---|---|---|---|---|---|---|
| 4-4 | 0 | 100 | 62.0 | 2.15 | 0.155 | 2.2 | 0.0005 |
| 4-5 | 60 | 40 | 11.0 | 2.06 | 0.152 | 2.9 | 0.0014 |
| 4-6 | 100 | 0 | 5.00 | 2.00 | 0.150 | 3.3 | 0.002 |

| Sample | Dehylub 4003, vol % | HR-PIB (Mn ~450 g/mol), vol % | Electrical resistivity, Ω · cm | Breakdown voltage, kV | Pour point, ° C. | Flash point, ° C. |
|---|---|---|---|---|---|---|
| 4-4 | 0 | 100 | $1.00 \times 10^{13}$ | 50 | −45 | 175 |
| 4-5 | 60 | 40 | $1.66 \times 10^{11}$ | 47 | −54 | 208 |
| 4-6 | 100 | 0 | $1.00 \times 10^{11}$ | 45 | −60 | 230 |

Overall, the data shown in Tables 4A and 4B indicate that aspects of the present disclosure that include blends of HR-PIB with another base fluid may be utilized for heat transfer compositions and heat transfer applications/uses, such as immersion cooling compositions and immersion cooling applications/uses. For example, Sample 4-2 of Table 4A indicates that a blend of 40 vol % low viscosity monoester and 60 vol % HR-PIB (Mn of about 350 g/mol) provided a KV40 of about 10 cSt and an increase in flash point to 170° C. or more (specifically, KV40=10.6 cSt and flash point=175° C.). Sample 4-5 of Table 4B indicates that a blend of 60 vol % low viscosity monoester and 40 vol % HR-PIB (Mn of about 450 g/mol) provided a KV40 of less than 10 cSt and a flash point of 170° C. or more (specifically, KV40=11 cSt and flash point=208° C.). Samples 4-2 and 4-5 also showed low dielectric loss and high electrical resistivity relative to the monoester alone, and where the HR-PIB fraction provides an enhancement of electrical insulation without materially degrading thermal conductivity or heat capacity.

Example 5: Blends of HR-PIB with Low-Viscosity Hydrocarbons as Heat Transfer Compositions In this example, C20 HR-PIB (which has a low viscosity) was blended with other low-viscosity hydrocarbons. C20 HR-PIB (≈pentaisobutylene) exhibits a KV40 of about 5.11 cSt, which is highly desirable for single-phase immersion cooling. C20 HR-PIB may be blended with other low-viscosity hydrocarbons, such as PAOs, GTL fluids, or isoparaffins. In Example 5, SYNFLUID® 2 (PAO 2, Chevron Phillips Chemical, KV40 of about 5.0) and GS310 (GTL fluid, Shell) were blended with C20 HR-PIB. GS310 is a Fischer-Tropsch isoparaffin. Here, the inventors found compositions that include a low-viscosity HR-PIB blended with a low-viscosity hydrocarbon, where the composition has a KV40≤10 cSt and a flash point ≥160° C., and exhibiting low dielectric constant, very low dielectric loss factor, and high electrical resistivity.

C20 HR-PIB/hydrocarbon samples and blends tested included: 0 vol % (Sample 5-1), 50 vol % (Sample 5-2), or 100 vol % (Sample 5-3) of SYNFLUID® 2 with the remainder C20 HR-PIB. Selected properties of the blend and the individual components of the blend are summarized in Table 5A.

TABLE 5A

| Sample | Synfluid 2, vol % | C20 HR-PIB, vol % | KV40, cSt | Specific heat capacity, J/g · K | Thermal conductivity, W/m · K | Dielectric constant | Dielectric loss factor |
|---|---|---|---|---|---|---|---|
| 5-1 | 0 | 100 | 5.0 | 2.12 | 0.150 | 2.1 | 0.0004 |
| 5-2 | 50 | 50 | 6.44 | 2.11 | 0.147 | 2.1 | 0.0004 |
| 5-3 | 100 | 0 | 8.50 | 2.10 | 0.145 | 2.1 | 0.0004 |

| Sample | Synfluid 2, vol % | C20 HR-PIB, vol % | Electrical resistivity, Ω · cm | Breakdown voltage, kV | Pour point, ° C. | Flash point, ° C. |
|---|---|---|---|---|---|---|
| 5-1 | 0 | 100 | $1.00 \times 10^{13}$ | 50 | −70 | 150 |
| 5-2 | 50 | 50 | $8.89 \times 10^{12}$ | 53 | −68 | 170 |
| 5-3 | 100 | 0 | $8.00 \times 10^{12}$ | 55 | −66 | 190 |

C20 HR-PIB/hydrocarbon samples and blends tested included: 0 vol % (Sample 5-4), 40 vol % (Sample 5-5), or 100 vol % (Sample 5-6) of GS310 with the remainder C20 HR-PIB. Selected properties of the blend and the individual components of the blend are summarized in Table 5B.

TABLE 5B

| Sample | GS310, vol % | C20 HR-PIB, vol % | KV40, cSt | Specific heat capacity, J/g · K | Thermal conductivity, W/m · K | Dielectric constant | Dielectric loss factor |
|---|---|---|---|---|---|---|---|
| 5-4 | 0 | 100 | 5.0 | 2.2 | 0.152 | 2.2 | 0.0005 |
| 5-5 | 40 | 60 | 5.5 | 2.1 | 0.149 | 2.1 | 0.0004 |
| 5-6 | 100 | 0 | 5.9 | 2.1 | 0.145 | 2.1 | 0.0004 |

| Sample | GS310, vol % | C20 HR-PIB, vol % | Electrical resistivity, Ω · cm | Breakdown voltage, kV | Pour point, ° C. | Flash point, ° C. |
|---|---|---|---|---|---|---|
| 5-4 | 0 | 100 | $1.00 \times 10^{13}$ | 52 | −60 | 160 |
| 5-5 | 40 | 60 | $1.00 \times 10^{13}$ | 49 | −38 | 162 |
| 5-6 | 100 | 0 | $1.00 \times 10^{13}$ | 45 | −6 | 165 |

Overall, the data shown in Tables 5A and 5B indicate that aspects of the present disclosure that include blends of HR-PIB with another base fluid may be utilized for heat transfer compositions and heat transfer applications/uses, such as immersion cooling compositions and immersion cooling applications/uses. The example shows that a low-viscosity HR-PIB may be blended with other low-viscosity hydrocarbons, such as polyalphaolefins, GTL fluids, or isoparaffins. For example, Sample 5-2 shows that a 50 vol % blend of PAO 2 (CP Chem Synfluid®) with C20 HR-PIB provided a KV40 of about 6.44 cSt and a flash point of about 170° C., exceeding OCP recommendations. Sample 5-5 shows that a 40 vol % blend of GTL fluid GS310 with C20 HR-PIB provided a KV40 of about 10 cSt and a flash point near 170° C. Both samples 5-2 and 5-5 had low dielectric constant (Sample 5-2:2.1; Sample 5-5:2.2), very low dielectric loss factors (about 0.0004 for both Sample 5-2 and Sample 5-5), and high electrical resistivity (Sample 5-2: $8.89 \times 10^{12}$ and Sample 5-5:$1.00 \times 10^{13}$).

Relative to the low-viscosity hydrocarbons such as PAO, GTL fluids, and isoparaffins, the HR-PIB blends may provide a lower cost immersion cooling fluid, an extended supply, and adjusted properties while maintaining, for example, a low dielectric constant, very low dielectric loss, and high electrical resistivity. C20 HR-PIB can be produced efficiently and at low costs relative to other commercially available synthetic hydrocarbons. From a supply and manufacturability perspective, C20 HR-PIB may be produced at scale using established polymerization or oligomerization processes. By contrast, other commercial synthetic hydrocarbons in the same viscosity class (KV40 from about 3 cSt to about 6 cSt) often face cost or capacity constraints for broad data-center deployment. Consequently, C20 HR-PIB provides a practical, scalable low-viscosity hydrocarbon backbone that may be economically co-formulated with PAO, GTL, or isoparaffins to meet OCP-aligned targets for KV40, flash point, and electrical performance.

Example 6: HR-PIB Base Fluids with Additives as Heat Transfer Compositions

As described herein, HR-PIB base fluids may be blended with additives. Additives may be used to enhance thermal and dielectric performance without compromising chemical stability or electrical insulation. Such additives may generally be present in concentrations below about 15 wt %, and may be selected, for example, to improve specific heat capacity and/or thermal conductivity.

One such class of compounds includes microencapsulated paraffin-based phase change materials (PCMs), which undergo reversible melting and solidification within the operating temperature range. During heating, the paraffin core melts and absorbs heat as latent heat of fusion, and upon cooling, it solidifies and releases the stored heat.

Compositions comprising an HR-PIB base fluid with or without PCM additives included the following samples: 0 wt % (Sample 6-1), 0.5 wt % (Sample 6-2), 3 wt % (Sample 6-3), and 5 wt % (Sample 6-4) of microencapsulated paraffin wax with the remainder C20 HR-PIB. Selected properties of the compositions are summarized in Table 6A.

TABLE 6A

| Sample | PCM, wt % | KV40, cSt | Specific heat capacity, J/g · K | Thermal conductivity, W/m · K | Dielectric constant | Dielectric loss factor |
|---|---|---|---|---|---|---|
| 6-1 | 0 | 5.11 | 2.12 | 0.150 | 2.1 | 0.0004 |
| 6-2 | 0.5 | 5.36 | 2.15 | 0.152 | 2.1 | 0.0005 |
| 6-3 | 3 | 6.64 | 2.24 | 0.159 | 2.2 | 0.0007 |
| 6-4 | 5 | 7.39 | 2.28 | 0.165 | 2.3 | 0.0008 |

| Sample | PCM, wt % | Electrical resistivity, Ω · cm | Breakdown voltage, kV | Pour point, ° C. | Flash point, ° C. |
|---|---|---|---|---|---|
| 6-1 | 0 | $1.00 \times 10^{13}$ | 50 | −70 | 150 |
| 6-2 | 0.5 | $9.99 \times 10^{12}$ | 50 | −70 | 150 |

TABLE 6A-continued

| | | | | | |
|---|---|---|---|---|---|
| 6-3 | 3 | $9.85 \times 10^{12}$ | 50 | −70 | 150 |
| 6-4 | 5 | $9.80 \times 10^{12}$ | 50 | −70 | 150 |

Overall, the data shown in Table 6A indicates that aspects of the present disclosure that include HR-PIB with additives may be utilized for heat transfer compositions and heat transfer applications/uses, such as immersion cooling compositions and immersion cooling applications/uses. For example, Sample 6-4 indicates that a blend with 5% PCM increased the heat capacity by about 7.5% and the thermal conductivity by about 10.0%.

Another class of additives that may be utilized includes thermally conductive materials such as hexagonal boron nitride (BN) particles. Hexagonal BN is an electrically insulating, thermally conductive ceramic that disperses well in hydrocarbon matrices such as C20 HR-PIB. The BN particles for this example were in platelet form.

Compositions comprising an HR-PIB base fluid with or without thermally conductive materials included the following samples: 0 wt % (Sample 6-5), 3 wt % (Sample 6-6), 5 wt % (Sample 6-7), and 15 wt % (Sample 6-8) of microencapsulated paraffin wax with the remainder C20 HR-PIB. Selected properties of the compositions are summarized in Table 6B.

TABLE 6B

| Sample | BN, wt % | KV40, cSt | Specific heat capacity, J/g · K | Thermal conductivity, W/m · K | Dielectric constant | Dielectric loss factor |
|---|---|---|---|---|---|---|
| 6-5 | 0 | 5.11 | 2.12 | 0.150 | 2.1 | 0.0004 |
| 6-6 | 3 | 5.29 | 2.08 | 0.180 | 2.1 | 0.0004 |
| 6-7 | 5 | 5.43 | 2.05 | 0.200 | 2.1 | 0.0004 |
| 6-8 | 15 | 6.38 | 1.92 | 0.310 | 2.2 | 0.0005 |

| Sample | BN, wt % | Electrical resistivity, Ω · cm | Breakdown voltage, kV | Pour point, ° C. | Flash point, ° C. |
|---|---|---|---|---|---|
| 6-5 | 0 | $1.00 \times 10^{13}$ | 50 | −70 | 150 |
| 6-6 | 3 | $9.99 \times 10^{12}$ | 49 | −70 | 150 |
| 6-7 | 5 | $9.98 \times 10^{12}$ | 48 | −70 | 150 |
| 6-8 | 15 | $9.93 \times 10^{12}$ | 43 | −70 | 150 |

Overall, the data shown in Table 6B indicates that aspects of the present disclosure that include HR-PIB with additives may be utilized for heat transfer compositions and heat transfer applications/uses, such as immersion cooling compositions and immersion cooling applications/uses. For example, Samples 6-6 and 6-7 indicate that small loadings (about 3-5 wt %) increase thermal conductivity without changing dielectric constant and dielectric loss, while preserving very high electrical resistivity. Higher loadings, such as about 10-15 wt %, showed larger thermal gains but gradually reduced breakdown strength and increased viscosity. For example, Sample 6-8 (at 15% loading), the BN additive had double the thermal conductivity than Sample 6-5 (0% loading of BN additive), while KV40 remained within the targeted processing range (for example, KV40≤10 cSt), and the dielectric constant stayed in an acceptable range.

Example 7: Mixture of HR-PIBs as Heat Transfer Compositions

One HR-PIB or a mixture/blend of two or more HR-PIBs may be utilized as a heat transfer composition. In this example, C20 HR-PIB, C24 HR-PIB, C28 HR-PIB, and mixtures thereof were tested for performance as a heat transfer composition/immersion cooling composition. Table 7 shows the amount of HR-PIB (in wt %) and selected properties of the compositions. The data was collected using standard, reproducible models. KV40 was predicted via the Refutas/ASTM D341 (Walther) method on weight fractions; flash point was predicted using a conservative linear rule-of-mixtures; and dielectric properties reflect typical International Electrotechnical Commission (IEC) 60247 behavior for nonpolar hydrocarbons.

Samples 7-1 and 7-2 are mixtures of C24 HR-PIB and C28 HR-PIB in different proportions. Samples 7-3, 7-4, and 7-5 are mixtures of C20 HR-PIB, C24 HR-PIB, and C28 HR-PIB in different proportions. Sample 7-6 is C24 HR-PIB alone. The parenthetical inside the description column is for illustrative purposes and is non-limiting.

TABLE 7

| Sample | Description | C20 HR-PIB, wt % | C24 HR-PIB, wt % | C28 HR-PIB, wt % | KV40, cSt | Flash point, ° C. | Pour point, ° C. |
|---|---|---|---|---|---|---|---|
| 7-1 | C24/C28 binary (anchor C24) | 0 | 72 | 28 | 8.92 | 176 | −51 |

TABLE 7-continued

| | | | | | | | |
|---|---|---|---|---|---|---|---|
| 7-2 | C24/C28 binary (higher flash) | 0 | 44 | 56 | 9.98 | 181 | −50 |
| 7-3 | C20/C24/C28 ternary (C24 anchor, trim C20 for KV40) | 18 | 41 | 41 | 8.57 | 175 | −51 |
| 7-4 | C20/C24/C28 ternary (High flash, sub-10 cSt KV40) | 19 | 2 | 79 | 9.92 | 182 | −49 |
| 7-5 | C20/C24/C28 ternary (Near-equal; baseline) | 33 | 33 | 34 | 7.76 | 170 | −52 |
| 7-6 | C24-only (reference) | 0 | 100 | 0 | 8.00 | 170 | −52 |

| Sample | C20 HR-PIB, wt % | C24 HR-PIB, wt % | C28 HR-PIB, wt % | Dielectric Constant | Dielectric Loss factor | Electrical resistivity, Ω · cm | Mw, g/mol | Mn, g/mol | Mw/Mn (PDI) |
|---|---|---|---|---|---|---|---|---|---|
| 7-1 | 0 | 72 | 28 | 2.14 | 0.000431 | $9.85 \times 10^{12}$ | 354 | 352 | 1.005 |
| 7-2 | 0 | 44 | 56 | 2.15 | 0.000442 | $9.71 \times 10^{12}$ | 369 | 367 | 1.006 |
| 7-3 | 18 | 41 | 41 | 2.14 | 0.000433 | $9.79 \times 10^{12}$ | 351 | 346 | 1.015 |
| 7-4 | 19 | 2 | 79 | 2.16 | 0.000448 | $9.60 \times 10^{12}$ | 372 | 365 | 1.017 |
| 7-5 | 33 | 33 | 34 | 2.13 | 0.000427 | $9.82 \times 10^{12}$ | 339 | 332 | 1.019 |
| 7-6 | 0 | 100 | 0 | 2.12 | 0.000420 | $1.00 \times 10^{13}$ | 338 | 338 | 1.000 |

Overall, the data shown in Table 7A indicates that aspects of the present disclosure that include one or more HR-PIBs may be utilized for heat transfer compositions and heat transfer applications/uses, such as immersion cooling compositions and immersion cooling applications/uses. For example, all samples 7-1 through 7-6 reliably met desired specifications for immersion cooling applications, for example, KV40≤10 cSt and a flash point ≥150° C. (such as ≥170° C.), and excellent dielectric performance. Here, the C24 HR-PIB cut (Sample 7-6) had a tight distribution and low PDI that can reliably meet desired specifications for immersion cooling applications (KV40=8.00 cSt and flash point=170° C.). The C24 HR-PIB cut can be adjusted when desired with directed trims from other HR-PIB fractions, such as adjacent fractions (C20 and/or C28) without compromising stability. Sample 7-1 is a mixture of C24 HR-PIB and C28 HR-PIB showing a higher KV40 (about 8.92 cSt) and a higher flash point (about 176° C.) relative to the C24 HR-PIB cut (Sample 7-6). The 44:56 mixture of C24 HR-PIB and C28 HR-PIB (Sample 7-2) showed an even higher KV40 of about 9.98 cSt and a very high flash point of about 181° C. With respect to ternary mixtures, Sample 7-3 included a C20 HR-PIB trim to, for example, lower the KV40 down to about 8.57 with a slightly reduced flash point of 175° C. Sample 7-4, with a low amount of C24 HR-PIB, maintains excellent properties, showing a KV40 of about 9.92 and a very high flash point of about 182° C. Sample 7-5 includes a near equal mixture of the C20, C24, and C28 HR-PIBs, and was found to achieve a lower KV40 (about 7.76 cSt) with approximately the same flash point (about 170° C.) relative to the C24 HR-PIB cut (Sample 7-6). The C24 HR-PIB appears to raise the flash point (about 175-182° C.) while keeping KV40<10 cSt; a small C20 trim can be utilized to lower viscosity when desired, with C24 remaining the anchor of the composition. Pour points were all within a range of −52 to −49° C., and dielectric behavior was typical of nonpolar hydrocarbons (low dielectric loss factor and high electrical resistivity). All samples exhibited low Mw/Mn values (PDI) from about 1.00 to about 1.019.

Aspects described herein generally relate to a new class of heat transfer compositions comprising HR-PIB, to processes for producing the heat transfer compositions, and for uses of the heat transfer compositions in, for example, immersion cooling applications, heat management methods, and heat management systems. HR-PIB base fluids described herein (such as C20-C28 HR PIB, such as C24 HR-PIB) have an good balance of viscosity, volatility, and dielectric performance. HR-PIB base fluids, such as a C24 HR-PIB, are, for example, light enough to keep KV40≤10 cSt (indicating pumpability and wetting), heavy enough for high flash point and low volatility, and are insulating. An HR-PIB may be mixed with another HR-PIB. Additionally, or alternatively, HR—PIB may be mixed with another base fluid and/or an optional additive.

Aspects Listing

The present disclosure provides, among others, the following aspects, each of which may be considered as optionally including any alternate aspects:

Aspect A1. A heat transfer composition, comprising: a base fluid, the base fluid comprising HR-PIB, the HR-PIB comprising: a first portion comprising polymer chains having alpha vinylidene groups; a second portion comprising polymer chains having beta vinylidene groups; a third portion comprising polymer chains having internal vinylidene groups, the internal vinylidene groups different from the beta vinylidene groups; an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and an amount of the second portion plus the third portion that is in a range from 0 wt % to less than 25 wt % based on the total wt % of the first portion, the second portion, and the third portion of the HR-PIB.

Aspect A2. The heat transfer composition according to Aspect A1, wherein the heat transfer composition is a single-phase immersion cooling composition.

Aspect A3. The heat transfer composition according to any one of Aspects A1-A2, wherein the HR-PIB has:

(a) an Mn in a range from about 150 g/mol to about 600 g/mol, such as from about 168 g/mol to about 560 g/mol, 180 g/mol to about 500 g/mol, such as from about 220 g/mol to about 480 g/mol, such as from about 280 g/mol to about 450 g/mol, such as from about 300 g/mol to about 400 g/mol, such as from about 320 g/mol to about 370 g/mol, such as from about 320 g/mol to about 350 g/mol, or from about 250 g/mol to about 450 g/mol, such as from about 280 g/mol to about 400 g/mol;

(b) an Mw/Mn in a range from greater than 1.0 to about 2.0, such as from about 1.05 to about 2.0, such as from about 1.15 to about 1.85, such as from about 1.3 to about 1.7, such as from about 1.4 to about 1.6, such as about 1.5, or from about 1.0 to about 1.7, such as from about 1.1 to about 1.6, such as from about 1.2 to about 1.5, such as from about 1.3 to about 1.4, such as about 1.3 or about 1.4, or in a range from about 1.0 to about 1.5, such as from about 1.0 to about 1.2, such as from about 1.0 to about 1.1, such as from about 1.0 to about 1.05; or (c) a combination thereof.

Aspect A4. The heat transfer composition according to any one of Aspects A1-A3, wherein the HR-PIB comprises a C12-C40 HR-PIB, such as a C14-C36 HR-PIB, such as a C20-C32 HR-PIB, such as a C24-C28 HR-PIB, or a C12-C36 HR-PIB, such as a C16-C32 HR-PIB, such as a C20-C28 HR-PIB, or a C20-C32 HR-PIB, or a C20-C24 HR-PIB, or a C24-C28 HR-PIB, or a C28-C36 HR-PIB, or a C20 HR-PIB, or a C24 HR-PIB, or a C28 HR-PIB, or a C32 HR-PIB, or a C36 HR-PIB.

Aspect A5. The heat transfer composition according to any one of Aspects A1-A4, wherein the HR-PIB comprises a C16-C32 HR-PIB.

Aspect A6. The heat transfer composition according to any one of Aspects A1-A5, wherein the heat transfer composition has one or more of the following properties:

a thermal conductivity (at 40° C., ASTM D2717) of about 0.12 W/m·K or more, such as in a range from about 0.12 W/m·K to about 0.20 W/m·K, such as from about 0.14 W/m·K to about 0.18 W/m·K, such as from about 0.15 W/m·K to about 0.16 W/m·K;

a specific heat capacity (at 40° C., ASTM D7896) of about 1.8 J/g·K or more, such as in a range from about 1.8 J/g·K to about 2.4 J/g·K, such as from about 2.0 J/g·K to about 2.3 J/g·K, such as from about 2.1 J/g·K to about 2.3 J/g·K, such as from about 2.2 J/g·K to about 2.25 J/g·K, or in a range from about 1.9 J/g·K to about 2.3 J/g·K, such as from about 2 J/g·K to about 2.2 J/g·K;

an electrical resistivity (at 25° C., ASTM D1169) of about $1\times10^{9}$ Ω·m or more, such as in a range from about $1\times10^{9}$ Ω·m to about $9.9\times10^{14}$ Ω·m, such as from about $1\times10^{11}$ Ω·m to about $9.9\times10^{14}$ Ω·m, such as from about $1\times10^{11}$ Ω·m to about $9.9\times10^{13}$ Ω·m;

a dielectric constant (at 25° C., ASTM D924) of about 3.5 or less, such as about 3.2 or less, such as about 3.0 or less, such as about 2.5 or less, such as about 2.3 or less (with a minimum of about 1.0), such as in a range from about 1.9 to about 2.5, such as from about 2.0 to about 2.4, such as from about 2.1 to about 2.3, such as about 2.2, or in a range from about 1.9 to about 2.2, such as from about 2.0 to about 2.1;

a dielectric loss factor (at 25° C., ASTM D924) of about 0.001 or less (with a lower limit of 0), such as in a range from about 0 to about 0.001, such as from about 0.0001 to about 0.001, such as from about 0.0002 to about 0.0009, such as from about 0.0003 to about 0.0008, such as from about 0.0004 to about 0.0007;

a dielectric strength (at 25° C., ASTM D877) of about 5 kV/mm or more;

a breakdown voltage (at 25° C., ASTM D877) of about 45 kV or more; or combinations thereof.

Aspect A7. The heat transfer composition according to any one of Aspects A1-A6, wherein the heat transfer composition has all of the following properties:

a dielectric strength (at 25° C., ASTM D877) of about 5 kV/mm or more;

an electrical resistivity (at 25° C., ASTM D1169) of about $1\times10^{11}$ Ω·m or more; and a dielectric constant (at 25° C., ASTM D924) of about 3.0 or less, such as about 2.5 or less, such as about 2.3 or less (with a minimum of about 1.0).

Aspect A8. The heat transfer composition according to any one of Aspects A1-A7, wherein the heat transfer composition has one or more of the following properties: (a) a kinematic viscosity at 40° C. (ASTM D445) in a range from about 1 cSt to about 150 cSt, or in a range from about 1 cSt to about 20 cSt, such as from about 2 cSt to about 20 cSt, such as from about 3 cSt to about 10 cSt; (b) a kinematic viscosity at 100° C. (ASTM D445) of about 20 cSt or less; (c) a viscosity index in a range from about 60 to about 170; (d) a pour point (ASTM D5949) of about −30° C. or less, such as in a range from about −80° C. to about −30° C.; (e) a flash point (ASTM D92) of about 125° C. or more, such as about 150° C. or more, such as in a range from about 150° C. to about 250° C.; or (f) combinations thereof.

Aspect A9. The heat transfer composition according to any one of Aspects A1-A8, wherein the heat transfer composition has one or more of the following properties: (a) a kinematic viscosity at 40° C. (ASTM D445) in a range from about 1 cSt to about 50 cSt; and (b) a flash point (ASTM D92) of about 150° C. or more, such as in a range from about 150° C. to about 250° C., such as from about 175° C. to about 250° C.

Aspect A10. The heat transfer composition according to any one of Aspects A1-A9, wherein the base fluid further comprises a polyalphaolefin, a synthetic ester, a bio-derived ester, a gas-to-liquids fluid, an isoparaffin, a polysiloxane, a group II base oil, a group III base oil, or combinations thereof, wherein the HR-PIB, the polyalphaolefin, the synthetic ester, the bio-derived ester, the gas-to-liquids fluid, the isoparaffin, the polysiloxane, the group II base oil, and the group III base oil are different base fluids.

Aspect A11. The heat transfer composition according to Aspect A10, wherein the PAO of the base fluid comprises a PAO having a kinematic viscosity (at 100° C., ASTM D445) in a range from about 1 cSt to about 10 cSt, such as from about 1.5 cSt to about 6 cSt.

Aspect A12. The heat transfer composition according to any one of Aspects A10-A11, wherein the gas-to-liquids fluid of the base fluid comprises a C12-C40 isoparaffin, such as a C14-C36 isoparaffin, such as a C16-C32 isoparaffin, such as a C20-C30 isoparaffin, or a C12-C25 isoparaffin.

Aspect A13. The heat transfer composition according to any one of Aspects A10-A12, wherein the isoparaffin of the base fluid comprises a C12-C40 isoparaffin, such as a C14-C36 isoparaffin, such as a C16-C32 isoparaffin, such as a C20-C30 isoparaffin, or a C12-C25 isoparaffin.

Aspect A14. The heat transfer composition according to any one of Aspects A10-A13, wherein the synthetic ester of the base fluid, the bio-derived ester of the base fluid, or combinations thereof comprises a monoester, a diester, a polyol ester, a triglyceride, or combinations thereof.

Aspect A15. The heat transfer composition according to any one of Aspects A1-A14, wherein the heat transfer composition further comprises:

a thermally conductive material, the thermally conductive material comprising a carbon-based material, a metal-containing material, or both;

a phase transition additive, the phase transition additive comprising an encapsulated paraffin wax, a metallic phase change material, an organic phase change material, or combinations thereof; or a combination thereof.

Aspect A16. The heat transfer composition according to Aspect A15, wherein the thermally conductive material comprises:

a carbon-based material, the carbon-based material comprising carbon nanotubes, graphene particles, graphene oxide particles, silicon carbide particles or combinations thereof;

a metal-containing material, the metal-containing material comprising alumina particles, aluminum nitride particles, copper particles, silver particles, boron nitride particles, copper particles, magnesium oxide particles, zinc oxide particles, or combinations thereof; or a combination thereof.

Aspect A17. The heat transfer composition according to Aspect A16, wherein the carbon nanotubes are functionalized with carboxylic acid (—COOH) groups or amine (—$NH_2$) groups.

Aspect A18. The heat transfer composition according to any one of Aspects A16-A17, wherein:

the graphene particles have a lateral dimension in a range from about 100 nm to about 10 μm, such as from about 200 nm to about 5 μm such as from about 300 nm to 3 μm such as from about 500 nm to about 2 μm;

the graphene oxide particles have a lateral dimension in a range from about 100 nm to about 10 μm, such as from about 200 nm to about 5 μm such as from about 300 nm to 3 μm such as from about 500 nm to about 2 μm; or a combination thereof.

Aspect A19. The heat transfer composition according to any one of Aspects A16-A18, wherein the heat transfer composition comprises:

an amount of the thermally conductive material that is in a range from about 0.001 wt % to about 20 wt %, such as from about 0.1 wt % to about 15 wt %, such as from about 1 wt % to about 10 wt %, such as from about 2 wt % to about 3 wt %, or from about 0.001 wt % to about 5 wt %, such as from about 0.1 wt % to about 3 wt % based on a total wt % of the base fluid and the thermally conductive material, the total wt % of the base fluid and the thermally conductive material is 100 wt %; and an amount of the base fluid that is in a range from about 80 wt % to about 99.999 wt %, such as from about 85 wt % to about 99.9 wt %, such as from about 90 wt % to about 99 wt %, such as from about 95 wt % to about 98 wt %, or from about 95 wt % to about 99.999 wt %, such as from about 97 wt % to about 99.9 wt % based on the total wt % of the base fluid and the thermally conductive material.

Aspect A20. The heat transfer composition according to any one of Aspects A16-A19, wherein the heat transfer composition has a thermal conductivity (at 40° C., ASTM D2717) that is about 1% or more, about 3% or more, about 5% or more, about 10% or more, about 15% or more, or about 20% or more, etc., and up to about 40% or less, about 35% or less, about 30% or less, about 25% or less, about 20% or less, or about 15% or less, etc., than a thermal conductivity of the composition without the thermally conductive material.

Aspect A21. The heat transfer composition according to any one of Aspects A1-A20, further comprising a phase transition additive.

Aspect A22. The heat transfer composition according to Aspect B20, wherein the phase transition additive comprises:

an encapsulated paraffin wax (for example, a microencapsulated paraffin wax with a melting point in a range from about 30° C. to about 70° C.);

a metallic phase change material (for example, gallium or a gallium-based alloy);

an organic phase change material (for example, an alkane, an ester, or a combination thereof); or combinations thereof.

Aspect 23. The heat transfer composition according to any one of Aspects A21-A22, wherein the heat transfer composition comprises:

an amount of the phase transition additive that is in a range from about 0.001 wt % to about 20 wt %, such as from about 0.1 wt % to about 15 wt %, such as from about 1 wt % to about 10 wt %, such as from about 2 wt % to about 3 wt %, or from about 0.001 wt % to about 5 wt %, such as from about 0.1 wt % to about 3 wt % based on a total wt % of the base fluid and the thermally conductive material, the total wt % of the base fluid and the thermally conductive material is 100 wt %; and an amount of the base fluid that is in a range from about 80 wt % to about 99.999 wt %, such as from about 85 wt % to about 99.9 wt %, such as from about 90 wt % to about 99 wt %, such as from about 95 wt % to about 98 wt %, or from about 95 wt % to about 99.999 wt %, such as from about 97 wt % to about 99.9 wt % based on the total wt % of the base fluid and the thermally conductive material.

Aspect A24. The heat transfer composition according to any one of Aspects A21-A23, wherein the heat transfer composition has a specific heat capacity (at 40° C., ASTM D7896) that is about 3% or more, about 5% or more, about 10% more, about 15% or more, or about 20% or more, etc., and up to about 50% or less, about 40% or less, about 35% or less, about 30% or less, about 25% or less, about 20% or less, or about 15% or less, etc. than a specific heat capacity (at 40° C., ASTM D7896) of the composition without the phase transition additive.

Aspect A25. The heat transfer composition according to any one of Aspects A21-A24, wherein the phase transition additive is encapsulated in a silica or polymer shell.

Aspect A26. The heat transfer composition according to any one of Aspects A21-A25, wherein the phase transition additive comprises a nanoencapsulated material that is uniformly dispersed (or substantially uniformly dispersed) in the composition, optionally using ultrasonic cavitation to achieve a stable emulsion with a particle size of about 1 micron or less, such as about 500 nm or less.

Aspect A27. The heat transfer composition according to any one of Aspects A1-A26, further comprising a thermally conductive material and/or a phase transition additive.

Aspect A28. The composition according to Aspect A27, wherein the heat transfer composition has a kinematic viscosity (at 40° C., ASTM D445) of about 150 cSt or less, such as in a range from about 1 cSt to about 150 cSt, such as from about 10 cSt to 125 cSt, such as from about 20 cSt to 100 cSt, such as from about 30 cSt to 75 cSt, or from about 1 cSt to about 50 cSt, such as from about 1 cSt to about 30 cSt, such as from about 5 cSt to about 25 cSt, such as from about 10 cSt to about 20 cSt, or in a range from about 1 cSt to about 20 cSt, such as from about 2 cSt to about 20 cSt, such as from about 3 cSt to about 10 cSt.

Aspect A29. The heat transfer composition according to any one of Aspects A27-A28, wherein the heat transfer composition comprises: a weight ratio of the thermally conductive material to the phase transition additive that is in a range from about 0.01:1 to about 1:1, such as from about 0.02:1 to about 0.5:1, such as from about 0.05:1 to about 0.2:1 (thermally conductive material:phase transition additive).

Aspect A30. The heat transfer composition according to any one of Aspects A27-A29, wherein the heat transfer composition has a breakdown voltage (at 25° C., ASTM D877) that is about 45 kV or more, such as in a range from about 45 kV to about 70 kV, such as from about 50 kV to about 65 kV, such as from about 55 kV to about 60 kV.

Aspect A31. The heat transfer composition according to any one of Aspects A27-A30, wherein:

the heat transfer composition has a thermal conductivity (at 40° C., ASTM D2717) that is about 1% or more, about 3% or more, about 5% or more, about 10% or more, about 15% or more, about 20% or more, etc., and up to about 40% or less, about 35% or less, about 30% or less, about 25% or less, about 20% or less, about 15% or less, etc., than a thermal conductivity of the composition without the thermally conductive material;

the heat transfer composition has a specific heat capacity (at 40° C., ASTM D7896) that is about 3% or more, about 5% or more, about 10% more, about 15% or more, or about 20% or more, etc., and up to about 50% or less, about 40% or less, about 35% or less, about 30% or less, about 25% or less, about 20% or less, or about 15% or less, etc. than a specific heat capacity (at 40° C., ASTM D7896) of the composition without the phase transition additive; or a combination thereof.

Aspect A32. The heat transfer composition according to any one of Aspects A1-A31, wherein the heat transfer composition further comprises an antioxidant.

Aspect A33. The heat transfer composition according to Aspect A31, wherein the antioxidant comprises:

a hindered phenol (for example, butylated hydroxytoluene (BHT), butylated hydroxanisol (BHA), pentaerythritol tetrakis(3-(3,5-di-tert-butyl-4-hydroxyphenyl) propionate) (Irganox 1010), octadecyl 3-(3,5-di-tert-butyl-4-hydroxyphenyl) propionate (Irganox 1076), or combinations thereof);

an aromatic amine (for example, diphenylamine, alkylated diphenyl amine, phenyl-alpha-napthylamine (PANA), or combinations thereof); or a combination thereof.

Aspect A34. The heat transfer composition according to any one of Aspects A1-A33, wherein the heat transfer composition has an oxidative stability (RPVOT (at 150° C., ASTM D2272)) that is about 500 hours or more, about 1,000 hours or more, about 2,000 hours or more, about 6,000 hours or more, about 8,000 hours or more, or about 10,000 hours or more, etc., and up to about 20,000 hours or less, about 15,000 hours or less, about 12,000 hours or less, about 10,000 hours or less, about 8,000 hours or less, or about 6,000 hours or less, etc.

Aspect A35. The heat transfer composition according to any one of Aspects A1-A34, wherein the heat transfer composition has one or more of the following properties:

a thermal conductivity (at 40° C., ASTM D2717) of about 0.12 W/m·K or more, such as in a range from about 0.12 W/m·K to about 0.20 W/m·K, such as from about 0.14 W/m·K to about 0.18 W/m·K, such as from about 0.15 W/m·K to about 0.16 W/m·K;

a specific heat capacity (at 40° C., ASTM D7896) of about 1.8 J/g·K or more, such as in a range from about 1.8 J/g·K to about 2.4 J/g·K, such as from about 2.0 J/g·K to about 2.3 J/g·K, such as from about 2.1 J/g·K to about 2.3 J/g·K, such as from about 2.2 J/g·K to about 2.25 J/g·K, or in a range from about 1.9 J/g·K to about 2.3 J/g·K, such as from about 2 J/g·K to about 2.2 J/g·K;

an electrical resistivity (at 25° C., ASTM D1169) of about $1\times10^9$ Ω·m or more, such as in a range from about $1\times10^9$ Ω·m to about $9.9\times10^{14}$ Ω·m, such as from about $1\times10^{11}$ Ω·m to about $9.9\times10^{14}$ Ω·m, such as from about $1\times10^{11}$ Ω·m to about $9.9\times10^{13}$ Ω·m;

a dielectric constant (at 25° C., ASTM D924) of about 3.5 or less, such as about 3.2 or less, such as about 3.0 or less, such as about 2.5 or less, such as about 2.3 or less (with a minimum of about 1.0), such as in a range from about 1.9 to about 2.5, such as from about 2.0 to about 2.4, such as from about 2.1 to about 2.3, such as about 2.2, or in a range from about 1.9 to about 2.2, such as from about 2.0 to about 2.1;

a dielectric loss factor (at 25° C., ASTM D924) of about 0.001 or less (with a lower limit of 0), such as in a range from about 0 to about 0.001, such as from about 0.0001 to about 0.001, such as from about 0.0002 to about 0.0009, such as from about 0.0003 to about 0.0008, such as from about 0.0004 to about 0.0007;

a dielectric strength (at 25° C., ASTM D877) of about 5 kV/mm or more;

a breakdown voltage (at 25° C., ASTM D877) of about 45 kV or more; or combinations thereof.

Aspect A36. A heat management method, comprising: contacting one or more articles (for example, a heat-generating article or a component affixed to a heat-generating article) with a heat transfer composition, the heat transfer composition comprising a base fluid, the base fluid comprising HR-PIB, the HR-PIB comprising: a first portion comprising polymer chains having alpha vinylidene groups; a second portion comprising polymer chains having beta vinylidene groups; a third portion comprising polymer chains having internal vinylidene groups, the internal vinylidene groups different from the beta vinylidene groups; an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and an amount of the second portion plus the third portion that is in a range from 0 wt % to less than 25 wt % based on the total wt % of the first portion, the second portion, and the third portion of the HR-PIB.

Aspect A37. The heat management method according to Aspect A36, wherein the HR-PIB has: (a) an Mn in a range from about 150 g/mol to about 600 g/mol, such as from about 168 g/mol to about 560 g/mol, 180 g/mol to about 500 g/mol, such as from about 220 g/mol to about 480 g/mol, such as from about 280 g/mol to about 450 g/mol, such as from about 300 g/mol to about 400 g/mol, such as from about 320 g/mol to about 370 g/mol, such as from about 320 g/mol to about 350 g/mol, or from about 250 g/mol to about 450 g/mol, such as from about 280 g/mol to about 400 g/mol; (b) an Mw/Mn in a range from greater than 1.0 to about 2.0, such as from about 1.05 to about 2.0, such as from about 1.15 to about 1.85, such as from about 1.3 to about 1.7, such as from about 1.4 to about 1.6, such as about 1.5, or from about 1.0 to about 1.7, such as from about 1.1 to about 1.6, such as from about 1.2 to about 1.5, such as from about 1.3 to about 1.4, such as about 1.3 or about 1.4, or in a range from about 1.0 to about 1.5, such as from about 1.0 to about 1.2, such as from about 1.0 to about 1.1, such as from about 1.0 to about 1.05; or (c) a combination thereof.

Aspect A38. The heat transfer composition according to any one of Aspects A36-A37, wherein the HR-PIB comprises a C12-C40 HR-PIB, such as a C14-C36 HR-PIB, such as a C20-C32 HR-PIB, such as a C24-C28 HR-PIB, or a C12-C36 HR-PIB, such as a C16-C32 HR-PIB, such as a C20-C28 HR-PIB, or a C20-C32 HR-PIB, or a C20-C24 HR-PIB, or a C24-C28 HR-PIB, or a C28-C36 HR-PIB, or a C20 HR-PIB, or a C24 HR-PIB, or a C28 HR-PIB, or a C32 HR-PIB, or a C36 HR-PIB.

Aspect A39. The heat management method according to any one of Aspects A36-A38, wherein contacting the heat transfer composition with the one or more heat-generating articles comprises: immersing the one or more heat-generating articles in the heat transfer composition; submerging the one or more heat-generating articles in the heat transfer composition; circulating the heat transfer composition through or between the one or more heat-generating articles; or combinations thereof.

Aspect A40. The heat management method according to any one of Aspects A36-A39, wherein the heat transfer composition comprises a heat transfer composition described herein, such as the heat transfer composition according to any one of Aspects A1-A35.

Aspect A41. The heat management method according to any one of Aspects A36-A40, wherein the one or more heat-generating articles comprises an electronic device, an electrical device, a component thereof, or combinations thereof.

Aspect A42. The heat management method according to any one of Aspects A36-A41, wherein the one or more articles (for example, one or more heat-generating articles or a component affixed to one or more heat-generating articles) comprises a server, a rack of a server, a motherboard, a memory board, a microprocessor, a chip, a fabricated electronic device (such as a semiconductor-fabricated electronic device), a battery, an inverter, a DC to DC inverter, a charger, a phase change inverter, an electric motor, an electric motor controller, a DC to AC inverter, a component thereof, or combinations thereof.

Aspect A43. A heat management system, comprising:

one or more articles (for example, a heat-generating article or a component affixed to a heat-generating article); and a heat transfer composition comprising a base fluid, the base fluid comprising HR-PIB, the HR-PIB comprising: a first portion comprising polymer chains having alpha vinylidene groups; a second portion comprising polymer chains having beta vinylidene groups; a third portion comprising polymer chains having internal vinylidene groups, the internal vinylidene groups different from the beta vinylidene groups; an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and an amount of the second portion plus the third portion that is in a range from 0 wt % to less than 25 wt % based on the total wt % of the first portion, the second portion, and the third portion of the HR-PIB.

Aspect A44. The heat management system according to Aspect A43, wherein the heat transfer composition comprises a heat transfer composition described herein, such as the heat transfer composition according to any one of Aspects A1-A35.

Aspect A45. The heat management system according to any one of Aspects A43-A44, wherein the one or more heat-generating articles comprises an electronic device, an electrical device, a component thereof, or combinations thereof.

Aspect A46. The heat management system according to any one of Aspects A43-A45, wherein the one or more articles (for example, one or more heat-generating articles or a component affixed to one or more heat-generating articles) comprises a server, a rack of a server, a motherboard, a memory board, a microprocessor, a chip, a fabricated electronic device (such as a semiconductor-fabricated electronic device), a battery, an inverter, a DC to DC inverter, a charger, a phase change inverter, an electric motor, an electric motor controller, a DC to AC inverter, a component thereof, or combinations thereof.

Aspect B1. A heat transfer composition, comprising:

a base fluid, the base fluid comprising HR-PIB.

Aspect B2. The heat transfer composition according to Aspect B1, wherein the HR-PIB of the base fluid has an Mn in a range from about 150 g/mol to about 600 g/mol.

The heat transfer composition according to any one of Aspects B1-B2, wherein the HR-PIB of the base fluid has a ratio of Mw/Mn in a range from greater than 1.0 to about 2.0, such as from about 1.05 to about 2.0, such as from about 1.15 to about 1.85, such as from about 1.3 to about 1.7, such as from about 1.4 to about 1.6, such as about 1.5, or from about 1.0 to about 1.7, such as from about 1.1 to about 1.6, such as from about 1.2 to about 1.5, such as from about 1.3 to about 1.4, such as about 1.3 or about 1.4, or in a range from about 1.0 to about 1.5, such as from about 1.0 to about 1.2, such as from about 1.0 to about 1.1, such as from about 1.0 to about 1.05.

Aspect B4. The heat transfer composition according to any one of Aspects B1-B3, wherein the composition is for single-phase immersion cooling of a heat-generating electronic component (for example, a server, a rack of a server, a motherboard, a memory board, a microprocessor, a chip, a battery, a computer electronic, an inverter, a DC to DC convertor, a charger, a phase change inverter, an electric motor, an electric motor controller, a DC to AC inverter, a fabricated electronic component such as semiconductor-fabricated electronic component, or combinations thereof).

Aspect B5. The heat transfer composition according to any one of Aspects B1-B4, wherein the HR-PIB has: an Mn in a range from about 168 g/mol to about 560 g/mol, 180 g/mol to about 500 g/mol, such as from about 220 g/mol to about 480 g/mol, such as from about 280 g/mol to about 450 g/mol, such as from about 300 g/mol to about 400 g/mol, such as from about 320 g/mol to about 370 g/mol, such as from about 320 g/mol to about 350 g/mol, or from about 250 g/mol to about 450 g/mol, such as from about 280 g/mol to about 400 g/mol; and an Mw/Mn in a range from greater than 1.0 to about 2.0, such as from about 1.05 to about 2.0, such as from about 1.15 to about 1.85, such as from about 1.3 to about 1.7, such as from about 1.4 to about 1.6, such as about 1.5, or from about 1.0 to about 1.7, such as from about 1.1 to about 1.6, such as from about 1.2 to about 1.5, such as from about 1.3 to about 1.4, such as about 1.3 or about 1.4, or in a range from about 1.0 to about 1.5, such as from about 1.0 to about 1.2, such as from about 1.0 to about 1.1, such as from about 1.0 to about 1.05.

Aspect B6. The heat transfer composition according to any one of Aspects B1-B5, wherein the heat transfer composition has one or more of the following properties: (a) a thermal conductivity (at 40° C., ASTM D2717) of about 0.12 W/m·K or more, such as in a range from about 0.12 W/m·K to about 0.20 W/m·K, such as from about 0.14 W/m·K to about 0.18 W/m·K, such as from about 0.15 W/m·K to about 0.16 W/m·K; (b) a specific heat capacity (at 40° C., ASTM D7896) of about 1.8 J/g·K or more, such as in a range from about 1.8 J/g·K to about 2.4 J/g·K, such as from about 2.0 J/g·K to about 2.3 J/g·K, such as from about 2.1 J/g·K to about 2.3 J/g·K, such as from about 2.2 J/g·K to about 2.25 J/g·K, or in a range from about 1.9 J/g·K to about 2.3 J/g·K, such as from about 2 J/g·K to about 2.2 J/g·K; (c) an electrical resistivity (at 25° C., ASTM D1169) of about $1\times10^9$ Ω·m or more, such as in a range from about $1\times10^9$ Ω·m to about $9.9\times10^{14}$ Ω·m, such as from about $1\times10^{11}$ Ω·m to about $9.9\times10^{14}$ Ω·m, such as from about $1\times 10^{11}$ Ω·m to about $9.9\times10^{13}$ Ω·m; (d) a dielectric constant (at 25° C., ASTM D924) about 3.5 or less, such as about 3.2 or less, such as about 3.0 or less, such as about 2.5 or less, such as about 2.3 or less (with a minimum of about 1.0), such as in a range from about 1.9 to about 2.5, such as from about 2.0 to about 2.4, such as from about 2.1 to about 2.3, such as about 2.2, or in a range from about 1.9 to about 2.2, such as from about 2.0 to about 2.1; or (e) combinations thereof.

Aspect B7. The heat transfer composition according to any one of Aspects B1-B6, wherein the HR-PIB of the base fluid comprises a C12-C40 HR-PIB, such as a C14-C36 HR-PIB, such as a C20-C32 HR-PIB, such as a C24-C28 HR-PIB, or a C12-C36 HR-PIB, such as a C16-C32 HR-PIB, such as a C20-C28 HR-PIB, or a C20-C32 HR-PIB, or a C20-C24 HR-PIB, or a C24-C28 HR-PIB, or a C28-C36 HR-PIB, or a C20 HR-PIB, or a C24 HR-PIB, or a C28 HR-PIB, or a C32 HR-PIB, or a C36 HR-PIB.

Aspect B8. The heat transfer composition according to any one of Aspects B1-B7, wherein: the base fluid further comprises a polyalphaolefin (PAO), a synthetic ester, a bio-derived ester, a gas-to-liquids (GTL) fluid, an isoparaffin, a polysiloxane, a silicone, a Group II base oil, a Group III base oil, or combinations thereof, wherein the HR-PIB, the PAO, the synthetic ester, the bio-derived ester, the GTL fluid, the isoparaffin, the polysiloxane, the silicone, the Group II base oil, and the Group III base oil are different base fluids.

Aspect B9. The heat transfer composition according to Aspect B8, wherein the PAO of the base fluid comprises a PAO having a kinematic viscosity (at 100° C., ASTM D445) in a range from about 1 cSt to about 10 cSt, such as from about 1.5 cSt to about 6 cSt.

Aspect B10. The heat transfer composition according to any one of Aspects B8-B9, wherein the synthetic ester of the base fluid, the bio-derived ester of the base fluid, or combinations thereof comprises a monoester, a diester, a polyol ester, or combinations thereof.

Aspect B11. The heat transfer composition according to any one of Aspects B8-B10, wherein the GTL fluid of the base fluid comprises a C12-C40 isoparaffin, such as a C14-C36 isoparaffin, such as a C16-C32 isoparaffin, such as a C20-C30 isoparaffin, or a C12-C25 isoparaffin.

Aspect B12. The heat transfer composition according to any one of Aspects B8-B11, wherein the isoparaffin of the base fluid comprises a C12-C40 isoparaffin, such as a C14-C36 isoparaffin, such as a C16-C32 isoparaffin, such as a C20-C30 isoparaffin, or a C12-C25 isoparaffin.

Aspect B13. The heat transfer composition according to any one of Aspects B8-B12, wherein the heat transfer composition has one or more of the following properties: (a) a thermal conductivity (at 40° C., ASTM D2717) of about 0.12 W/m·K or more, such as in a range from about 0.12 W/m·K to about 0.20 W/m·K, such as from about 0.14 W/m·K to about 0.18 W/m·K, such as from about 0.15 W/m·K to about 0.16 W/m·K; (b) a specific heat capacity (at 40° C., ASTM D7896) of about 1.80 J/g·K or more, such as in a range from about 1.8 J/g·K to about 2.4 J/g·K, such as from about 2.0 J/g·K to about 2.3 J/g·K, such as from about 2.1 J/g·K to about 2.3 J/g·K; (c) an electrical resistivity (at 25° C., ASTM D1169) of about $1\times10^9$ Ω·m or more, such as in a range from about $1\times10^9$ Ω·m to about $9.9\times10^{14}$ Ω·m, such as from about $1\times10^{11}$ Ω·m to about $9.9\times10^{14}$ Ω·m, such as from about $1\times10^{11}$ Ω·m to about $9.9\times10^{13}$ Ω·m; (d) a dielectric constant (at 25° C., ASTM D924) of about 2.5 or less, such as in a range from about 1.9 to about 2.5, such as from about 2.0 to about 2.5, such as from about 2.1 to about 2.3; or (e) combinations thereof.

Aspect B14. The heat transfer composition according to any one of Aspects B1-B13, further comprising a thermally conductive material.

Aspect B15. The heat transfer composition according to Aspect B14, wherein the thermally conductive material comprises: (a) a carbon-based material, the carbon-based material comprising carbon nanotubes, graphene particles, graphene oxide particles, silicon carbide particles or combinations thereof; (b) a metal-containing material, the metal-containing material comprising alumina particles, aluminum nitride particles, copper particles, silver particles, boron nitride particles, copper particles, magnesium oxide particles, zinc oxide particles, or combinations thereof; or (c) a combination thereof.

Aspect B16. The heat transfer composition according to Aspect B15, wherein the carbon nanotubes are functionalized with carboxylic acid (—COOH) groups or amine (—$NH_2$) groups.

Aspect B17. The heat transfer composition according to any one of Aspects B15-B16, wherein: (a) the graphene particles have a lateral dimension in a range from about 100 nm to about 10 μm, such as from about 200 nm to about 5 μm such as from about 300 nm to 3 μm such as from about 500 nm to about 2 μm; (b) the graphene oxide particles have a lateral dimension in a range from about 100 nm to about 10 μm, such as from about 200 nm to about 5 μm such as from about 300 nm to 3 μm such as from about 500 nm to about 2 μm; or (c) a combination thereof.

Aspect B18. The heat transfer composition according to any one of Aspects B14-B17, wherein the heat transfer composition comprises: (a) an amount of the thermally conductive material that is in a range from about 0.001 wt % to about 20 wt %, such as from about 0.1 wt % to about 15 wt %, such as from about 1 wt % to about 10 wt %, such as from about 2 wt % to about 3 wt %, or from about 0.001 wt % to about 5 wt %, such as from about 0.1 wt % to about 3 wt % based on a total wt % of the base fluid and the thermally conductive material, the total wt % of the base fluid and the thermally conductive material is 100 wt %; (b) an amount of the base fluid that is in a range from about 80 wt % to about 99.999 wt %, such as from about 85 wt % to about 99.9 wt %, such as from about 90 wt % to about 99 wt %, such as from about 95 wt % to about 98 wt %, or from about 95 wt % to about 99.999 wt %, such as from about 97 wt % to about 99.9 wt % based on the total wt % of the base fluid and the thermally conductive material.

Aspect B19. The heat transfer composition according to any one of Aspects B14-B18, wherein the heat transfer composition has a thermal conductivity (at 40° C., ASTM D2717) that is about 1% or more, about 3% or more, about 5% or more, about 10% or more, about 15% or more, or about 20% or more, etc., and up to about 40% or less, about 35% or less, about 30% or less, about 25% or less, about 20% or less, or about 15% or less, etc., than a thermal conductivity of the composition without the thermally conductive material.

Aspect B20. The heat transfer composition according to any one of Aspects B1-B19, further comprising a phase transition additive.

Aspect B21. The heat transfer composition according to Aspect B20, wherein the phase transition additive comprises: (a) an encapsulated paraffin wax (for example, a microencapsulated paraffin wax with a melting point in a range from about 30° C. to about 70° C.); (b) a metallic phase change material (for example, gallium or a gallium-based alloy); (c) an organic phase change material (for example, an alkane, an ester, or a combination thereof); or combinations thereof.

Aspect B22. The heat transfer composition according to any one of Aspects B20-B21, wherein the heat transfer composition has a specific heat capacity (at 40° C., ASTM D7896) that is about 3% or more, about 5% or more, about 10% more, about 15% or more, or about 20% or more, etc., and up to about 50% or less, about 40% or less, about 35% or less, about 30% or less, about 25% or less, about 20% or less, or about 15% or less, etc. than a specific heat capacity (at 40° C., ASTM D7896) of the composition without the phase transition additive.

Aspect B23. The heat transfer composition according to any one of Aspects B20-B22, wherein the phase transition additive is encapsulated in a silica or polymer shell.

Aspect B24. The heat transfer composition according to any one of Aspects B20-B23, wherein the phase transition additive comprises a nanoencapsulated material that is uniformly dispersed (or substantially uniformly dispersed) in the composition, optionally using ultrasonic cavitation to achieve a stable emulsion with a particle size of about 1 micron or less, such as about 500 nm or less.

Aspect B25. The heat transfer composition according to any one of Aspects B1-B24, further comprising a thermally conductive material and a phase transition additive.

Aspect B26. The composition according to Aspect B25, wherein the heat transfer composition has a kinematic viscosity (at 40° C., ASTM D445) of about 150 cSt or less, such as in a range from about 1 cSt to about 150 cSt, such as from about 10 cSt to 125 cSt, such as from about 20 cSt to 100 cSt, such as from about 30 cSt to 75 cSt, or from about 1 cSt to about 50 cSt, such as from about 1 cSt to about 30 cSt, such as from about 5 cSt to about 25 cSt, such as from about 10 cSt to about 20 cSt.

Aspect B27. The heat transfer composition according to any one of Aspects B25-B26, wherein the heat transfer composition comprises: (a) a weight ratio of the thermally conductive material to the phase transition additive that is selected to maintain a kinematic viscosity (at 40° C., ASTM D445) of the heat transfer composition at about 150 cSt or less; (b) a weight ratio of the thermally conductive material to the phase transition additive that is in a range from about 0.01:1 to about 1:1, such as from about 0.02:1 to about 0.5:1, such as from about 0.05:1 to about 0.2:1 (thermally conductive material:phase transition additive); or (c) a combination thereof.

Aspect B28. The heat transfer composition according to any one of Aspects B25-B27, wherein the heat transfer composition has a breakdown voltage (at 25° C., ASTM D877) that is about 45 kV or more, such as in a range from about 45 kV to about 70 kV, such as from about 50 kV to about 65 kV, such as from about 55 kV to about 60 kV.

Aspect B29. The heat transfer composition according to any one of Aspects B25-B28, wherein: (a) the heat transfer composition has a thermal conductivity (at 40° C., ASTM D2717) that is about 1% or more, about 3% or more, about 5% or more, about 10% or more, about 15% or more, about 20% or more, etc., and up to about 40% or less, about 35% or less, about 30% or less, about 25% or less, about 20% or less, about 15% or less, etc., than a thermal conductivity of the composition without the thermally conductive material; (b) the heat transfer composition has a specific heat capacity (at 40° C., ASTM D7896) that is about 3% or more, about 5% or more, about 10% more, about 15% or more, or about 20% or more, etc., and up to about 50% or less, about 40% or less, about 35% or less, about 30% or less, about 25% or less, about 20% or less, or about 15% or less, etc. than a specific heat capacity (at 40° C., ASTM D7896) of the composition without the phase transition additive; or (c) a combination thereof.

Aspect B30. The heat transfer composition according to any one of Aspects B1-B29, wherein the heat transfer composition has a dielectric loss factor (at 25° C., ASTM D924) that is about 0.001 or less, such as in a range from about 0.0002 to about 0.001, such as from about 0.0003 to about 0.0008, such as from about 0.0004 to about 0.0007.

Aspect B31. The heat transfer composition according to any one of Aspects B1-B30, further comprising an antioxidant.

Aspect B32. The heat transfer composition according to Aspect B31, wherein the antioxidant comprises: (a) a hindered phenol (for example, butylated hydroxytolulene (BHT), butylated hydroxanisol (BHA), pentaerythritol tetrakis(3-(3,5-di-tert-butyl-4-hydroxyphenyl) propionate) (Irganox 1010), octadecyl 3-(3,5-di-tert-butyl-4-hydroxyphenyl) propionate (Irganox 1076), or combinations thereof); (b) an aromatic amine (for example, diphenylamine, alkylated diphenyl amine, phenyl-alpha-napthylamine (PANA), or combinations thereof); or (c) a combination thereof.

Aspect B33. The heat transfer composition according to any one of Aspects B31-B32, wherein the heat transfer composition has an oxidative stability (RPVOT (at 150° C., ASTM D2272)) that is about 500 hours or more, about 1,000 hours or more, about 2,000 hours or more, about 6,000 hours or more, about 8,000 hours or more, or about 10,000 hours or more, etc. and up to about 20,000 hours or less, about 15,000 hours or less, about 12,000 hours or less, about 10,000 hours or less, about 8,000 hours or less, or about 6,000 hours or less, etc.

Aspect C1. A process for producing a heat transfer composition (for example, an immersion cooling composition), the process comprising:

forming a heat transfer composition described herein, by, for example, blending, mixing, high-shear mixing sonication, ultrasonication, cavitation, ultrasonic cavitation, or combinations thereof one or more components of a heat transfer composition.

Aspect C2. A process for producing a heat transfer composition (for example, an immersion cooling composition), the process comprising:

dispersing a thermally conductive material in a base fluid (for example, HR-PIB and one or more optional base fluids) under high-shear mixing conditions to form a mixture, the thermally conductive material comprising carbon nanotubes, graphene particles, graphene oxide particles, silicon carbide particles, boron nitride particles, aluminum nitride particles, copper (Cu) particles, or combinations thereof, such as carbon nanotubes, boron nitride particles, aluminum nitride particles, or combinations thereof; and optionally filtering the mixture to produce a heat transfer composition.

Aspect C3. The process according to any one of Aspects C1-$C_2$, wherein the heat transfer composition comprises the heat transfer composition according to any one of Aspects B1-B33.

Aspect C4. The process according to any one of Aspects C1-C3, wherein the high-shear mixing conditions comprise: a shear rate of at least 10,000 $s^{-1}$, optionally in a range from about 10,000 $s^{-1}$ to about 100,000 $s^{-1}$; a duration in a range from about 5 minutes to about 60 minutes; a temperature in a range from about 20° C. to about 80° C.; or combinations thereof.

Aspect C5. The process according to any one of Aspects C1-C4, wherein the filtering the mixture is performed to achieve a particle size distribution (PSD) of the thermally conductive material in the heat transfer composition that is 1 micron or less, such as 500 nm or less, such as about 200 nm or less.

Aspect C6. The process according to any one of Aspects C1-C5, further comprising dispersing a surfactant in the mixture.

Aspect C7. The process according to any one of Aspects C1-C6, wherein the carbon nanotubes are surface-functionalized (for example, with carboxylic acid (—COOH) groups or amine (—$NH_2$) groups).

Aspect C8. The process according to any one of Aspects C1-C7, further comprising dispersing a phase transition additive in the mixture prior to the filtering the mixture.

Aspect C9. The process according to Aspect C8, wherein the phase transition additive comprises an encapsulated paraffin wax (for example, a microencapsulated paraffin wax with a melting point in a range from about 30° C. to about 70° C.).

Aspect C10. The process according to any one of Aspects C8-C9, wherein the dispersing the phase transition additive in the mixture is performed using ultrasonic cavitation.

Aspect C11. The process according to any one of Aspects C8-C10, wherein, after the filtering, the encapsulated phase transition additive is uniformly dispersed (or substantially uniformly dispersed) in the heat transfer composition to achieve a phase transition additive with a particle size of about 1 micron or less, such as 500 nm or less, such as about 200 nm or less.

Aspect C12. The process according to any one of Aspects C1-C11, wherein the heat transfer composition has a dielectric loss factor (at 25° C., ASTM D924) below 0.001.

Aspect C13. The process according to any one of Aspects C1-C12, wherein the process produces the heat transfer composition according to any one of Aspects B1-B33.

Aspect D1. A heat management method (for example, an immersion cooling method), comprising: introducing a heat transfer composition described herein with an electronic component.

Aspect D2. The heat management method according to Aspect D1, wherein the heat transfer composition comprises the composition according to any one of Aspects B1-B33.

Aspect D3. The heat management method according to any one of Aspects D1-D2, wherein the introducing the heat transfer composition to the electronic component comprises: immersing an electronic component (for example, a semiconductor-fabricated electronic component) in the heat transfer composition; submerging an electronic component (for example, a server) in the heat transfer composition; circulating the heat transfer composition through electronic components (for example, between racks of a server); or a combination thereof.

Aspect D4. The heat management method according to any one of Aspects D1-D3, wherein the electronic component is a heat-generating electronic component.

Aspect D5. The heat management method according to any one of Aspects D1-D4, wherein the electronic component comprises a server, a rack of a server, a motherboard, a memory board, a microprocessor, a chip, a battery, a computer electronic, an inverter, a DC to DC convertor, a charger, a phase change inverter, an electric motor, an electric motor controller, a DC to AC inverter, a fabricated electronic component such as semiconductor-fabricated electronic component, or combinations thereof.

All documents described herein are incorporated by reference herein, including any priority documents and/or testing procedures to the extent they are not inconsistent with this text. As is apparent from the foregoing general description and the specific aspects, while forms of the aspects have been illustrated and described, various modifications may be made without departing from the spirit and scope of the present disclosure. Accordingly, it is not intended that the present disclosure be limited thereby. Likewise, the term "comprising" is considered synonymous with the term "including." Likewise whenever a composition, an element, a group of elements, or a method is preceded with the transitional phrase "comprising," it is understood that we also contemplate the same composition, method, or group of elements with transitional phrases "consisting essentially of," "consisting of," "selected from the group of consisting of," or "Is" preceding the recitation of the composition, element, elements, or method, and vice versa, such as the terms "comprising," "consisting essentially of," "consisting of" also include the product of the combinations of elements listed after the term.

In the foregoing, reference is made to aspects of the disclosure. However, it should be understood that the disclosure is not limited to specific described aspects. Instead, any combination of the following features and elements, whether related to different aspects or not, is contemplated to implement and practice the disclosure. Furthermore, although aspects of the disclosure may achieve advantages over other possible solutions and/or over the prior art, whether or not a particular advantage is achieved by a given aspect is not limiting of the disclosure. Thus, the foregoing aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. For example, the recitation of the numerical range 1 to 5 includes the subranges 1 to 4, 1.5 to 4.5, 1 to 2, among other subranges. As another example, the recitation of the numerical ranges 1 to 5, such as 2 to 4, includes the subranges 1 to 4 and 2 to 5, among other subranges. Additionally, within a range includes every point or individual value between its end points even though not explicitly recited. For example, the recitation of the numerical range 1 to 5 includes the numbers 1, 1.5, 2, 2.75, 3, 3.80, 4, 5, among other numbers. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise. For example, aspects comprising an "additive" include aspects comprising one, two, or more additives, unless specified to the contrary or the context clearly indicates only one additive is included.

While the foregoing is directed to aspects of the present disclosure, other and further aspects of the disclosure may be devised without departing from the basic scope thereof, and the scope thereof is determined by the claims that follow.

What is claimed is:

1. A heat transfer composition, comprising:
- a base fluid comprising:
  - highly reactive polyisobutylene (HR-PIB), the HR-PIB comprising:
    - a first portion comprising polymer chains having alpha vinylidene groups;
    - a second portion comprising polymer chains having beta vinylidene groups;
    - a third portion comprising polymer chains having internal vinylidene groups, the internal vinylidene groups different from the beta vinylidene groups;
    - an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and
    - an amount of the second portion plus the third portion that is in a range from 0 wt % to less than 25 wt % based on the total wt % of the first portion, the second portion, and the third portion of the HR-PIB; and
- the heat transfer composition further comprises one or more of:
  - a thermally conductive material comprising a carbon-based material, a metal-containing material, or a combination thereof; or
  - a phase transition additive comprising an encapsulated paraffin wax, a metallic phase change material, an organic phase change material, or combinations thereof.

2. The heat transfer composition according to claim 1, wherein the heat transfer composition is a single-phase immersion cooling composition.

3. The heat transfer composition according to claim 1, wherein the HR-PIB has:
- a number-average molecular weight (Mn) in a range from about 168 g/mol to about 560 g/mol;
- an Mw/Mn in a range from greater than 1.0 to about 2.0; or
- a combination thereof.

4. The heat transfer composition according to claim 1, wherein the HR-PIB comprises a C12-C36 HR-PIB.

5. The heat transfer composition according to claim 1, wherein the HR-PIB comprises a C16-C32 HR-PIB.

6. The heat transfer composition according to claim 1, wherein the heat transfer composition has one or more of the following properties:
- a thermal conductivity (at 40° C., ASTM D2717) of about 0.12 W/m·K or more;
- a specific heat capacity (at 40° C., ASTM D7896) of about 1.8 J/g·K or more;
- an electrical resistivity (at 25° C., ASTM D1169) of about $1\times10^{9}$ Ω·m or more;
- a dielectric constant (at 25° C., ASTM D924) of about 2.5 or less;
- a dielectric loss factor (at 25° C., ASTM D924) of about 0.001 or less;
- a dielectric strength (at 25° C., ASTM D877) of about 5 kV/mm or more;
- a breakdown voltage (at 25° C., ASTM D877) of about 45 kV or more; or
- combinations thereof.

7. The heat transfer composition according to claim 1, wherein the heat transfer composition has all of the following properties:
- a dielectric strength (at 25° C., ASTM D877) of about 5 kV/mm or more;
- an electrical resistivity (at 25° C., ASTM D1169) of about $1\times10^{11}$ Ω·m or more; and
- a dielectric constant (at 25° C., ASTM D924) of about 2.5 or less.

8. The heat transfer composition according to claim 1, wherein the heat transfer composition has one or more of the following properties:
- a pour point (ASTM D5949) of about −30° C. or less;
- a flash point (ASTM D92) of about 125° C. or more;
- a kinematic viscosity at 40° C. (ASTM D445) in a range from about 1 cSt to about 150 cSt;
- a kinematic viscosity at 100° C. (ASTM D445) of about 20 cSt or less; or
- combinations thereof.

9. The heat transfer composition according to claim 1, wherein the heat transfer composition has one or more of the following properties:
- a kinematic viscosity at 40° C. (ASTM D445) in a range from about 1 cSt to about 50 cSt; and
- a flash point (ASTM D92) of about 150° C. or more.

10. The heat transfer composition according to claim 1, wherein the base fluid further comprises a polyalphaolefin, a synthetic ester, a bio-derived ester, a gas-to-liquids fluid, an isoparaffin, a polysiloxane, a group II base oil, a group III base oil, or combinations thereof, wherein the HR-PIB, the polyalphaolefin, the synthetic ester, the bio-derived ester, the gas-to-liquids fluid, the isoparaffin, the polysiloxane, the group II base oil, and the group III base oil are different base fluids.

11. The heat transfer composition according to claim 10, wherein the polyalphaolefin of the base fluid comprises a polyalphaolefin having a kinematic viscosity (at 100° C., ASTM D445) in a range from about 1 cSt to about 10 cSt.

12. The heat transfer composition according to claim 10, wherein the gas-to-liquids fluid of the base fluid comprises a C12-C40 isoparaffin.

13. The heat transfer composition according to claim 1, wherein:
- the carbon-based material comprises carbon nanotubes, graphene particles, graphene oxide particles, silicon carbide particles, or combinations thereof; or the metal-containing material comprises alumina particles, aluminum nitride particles, copper particles, silver particles, boron nitride particles, magnesium oxide particles, zinc oxide particles, or combinations thereof.

14. The heat transfer composition according to claim 1, further comprising an antioxidant, the antioxidant comprising a hindered phenol, an aromatic amine, or a combination thereof.

15. A heat management method, comprising:

contacting one or more heat-generating articles with a heat transfer composition, the heat transfer composition comprising:

a base fluid comprising highly reactive polyisobutylene (HR-PIB), the HR-PIB comprising:

a first portion comprising polymer chains having alpha vinylidene groups;

a second portion comprising polymer chains having beta vinylidene groups;

a third portion comprising polymer chains having internal vinylidene groups, the internal vinylidene groups different from the beta vinylidene groups;

an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and an amount of the second portion plus the third portion that is in a range from 0 wt % to less than 25 wt % based on the total wt % of the first portion, the second portion, and the third portion of the HR-PIB; and the heat transfer composition further comprises one or more of:

a thermally conductive material comprising a carbon-based material, a metal-containing material, or a combination thereof; or a phase transition additive comprising an encapsulated paraffin wax, a metallic phase change material, an organic phase change material, or combinations thereof.

16. The heat management method according to claim 15, wherein the HR-PIB has:

a number-average molecular weight (Mn) in a range from about 168 g/mol to about 560 g/mol;

an Mw/Mn in a range from greater than 1.0 to about 2.0; or a combination thereof.

17. The heat management method according to claim 15, wherein contacting the heat transfer composition with the one or more heat-generating articles comprises:

immersing the one or more heat-generating articles in the heat transfer composition;

submerging the one or more heat-generating articles in the heat transfer composition;

circulating the heat transfer composition through or between the one or more heat-generating articles; or combinations thereof.

18. The heat management method according to claim 15, wherein the one or more heat-generating articles comprise an electronic device, an electrical device, a component thereof, or combinations thereof.

19. The heat management method according to claim 15, wherein the one or more heat-generating articles comprise a server, a rack of a server, a motherboard, a memory board, a microprocessor, a chip, a fabricated electronic device, a battery, an inverter, a DC to DC inverter, a charger, a phase change inverter, an electric motor, an electric motor controller, a DC to AC inverter, a component thereof, or combinations thereof.

20. A heat management system, comprising:

one or more heat-generating articles; and a heat transfer composition comprising:

a base fluid comprising highly reactive polyisobutylene (HR-PIB), the HR-PIB comprising:

a first portion comprising polymer chains having alpha vinylidene groups;

a second portion comprising polymer chains having beta vinylidene groups;

a third portion comprising polymer chains having internal vinylidene groups, the internal vinylidene groups different from the beta vinylidene groups;

an amount of the first portion that is in a range from greater than 75 wt % to 100 wt % based on a total wt % of the first portion, the second portion, and the third portion of the HR-PIB, the total wt % of the first portion, the second portion, and the third portion of the HR-PIB is equal to 100 wt %; and an amount of the second portion plus the third portion that is in a range from 0 wt % to less than 25 wt % based on the total wt % of the first portion, the second portion, and the third portion of the HR-PIB; and the heat transfer composition further comprises one or more of:

a thermally conductive material comprising a carbon-based material, a metal-containing material, or a combination thereof; or a phase transition additive comprising an encapsulated paraffin wax, a metallic phase change material, an organic phase change material, or combinations thereof.

* * * * *